United States Patent
Ominami et al.

(10) Patent No.: US 9,741,526 B2
(45) Date of Patent: Aug. 22, 2017

(54) CHARGED PARTICLE BEAM APPARATUS AND SAMPLE IMAGE ACQUIRING METHOD

(71) Applicant: Hitachi High-Technologies Corporation, Minato-ku, Tokyo (JP)

(72) Inventors: Yusuke Ominami, Tokyo (JP); Masako Nishimura, Tokyo (JP); Shinsuke Kawanishi, Tokyo (JP); Hiroyuki Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/912,521

(22) PCT Filed: Mar. 10, 2014

(86) PCT No.: PCT/JP2014/056094
§ 371 (c)(1),
(2) Date: Feb. 17, 2016

(87) PCT Pub. No.: WO2015/033601
PCT Pub. Date: Mar. 12, 2015

(65) Prior Publication Data
US 2016/0203944 A1    Jul. 14, 2016

(30) Foreign Application Priority Data
Sep. 6, 2013    (JP) .................................. 2013-184600

(51) Int. Cl.
*H01J 37/16*    (2006.01)
*H01J 37/26*    (2006.01)
(Continued)

(52) U.S. Cl.
CPC .............. *H01J 37/16* (2013.01); *H01J 37/18* (2013.01); *H01J 37/20* (2013.01); *H01J 37/263* (2013.01);
(Continued)

(58) Field of Classification Search
CPC .......... H01J 37/16; H01J 37/263; H01J 37/20; H01J 37/28; H01J 37/18; H01J 2237/202; H01J 2237/28; H01J 2237/164
(Continued)

(56) References Cited

U.S. PATENT DOCUMENTS 8,164,057 B2 * 4/2012 Shachal .................. H01J 37/20
                                              250/306
8,334,510 B2 * 12/2012 Shachal ................. G01N 23/22
                                              250/306
(Continued)

FOREIGN PATENT DOCUMENTS

DE    11 2013 003 552 T5    4/2015
JP        2012-221766 A    11/2012
(Continued)

OTHER PUBLICATIONS

International Search Report (PCT/ISA/210) issued in PCT Application No. PCT/JP2014/056094 dated Apr. 22, 2014 with English translation (four pages).
(Continued)

*Primary Examiner* — Michael Maskell
(74) *Attorney, Agent, or Firm* — Crowell & Moring LLP

(57) ABSTRACT

Disclosed is a charged particle beam apparatus wherein a partitioning film capable of transmitting a charged particle beam is provided between a charged particle optical system and a sample, said charged particle beam apparatus eliminating a contact between the sample and the partitioning film even in the cases where the sample has recesses and pro-
(Continued)

trusions. On the basis of detection signals or an image generated on the basis of the detection signals, a distance between a sample and a partitioning film is monitored, said detection signals being outputted from a detector that detects secondary charged particles discharged from the sample due to irradiation of a primary charged particle beam.

6 Claims, 19 Drawing Sheets

(51) Int. Cl.
  *H01J 37/18* (2006.01)
  *H01J 37/20* (2006.01)
  *H01J 37/28* (2006.01)
(52) U.S. Cl.
  CPC ......... *H01J 37/28* (2013.01); *H01J 2237/164* (2013.01); *H01J 2237/202* (2013.01); *H01J 2237/28* (2013.01)
(58) Field of Classification Search
  USPC .................................. 250/306, 307, 310, 311
  See application file for complete search history.

(56) References Cited

U.S. PATENT DOCUMENTS

| 8,981,294 | B2* | 3/2015 | Shachal | H01J 37/28 250/306 |
| 2004/0046120 | A1 | 3/2004 | Moses et al. | |
| 2007/0210253 | A1* | 9/2007 | Behar | B01L 3/508 250/311 |
| 2014/0021347 | A1 | 1/2014 | Ominami et al. | |
| 2014/0070097 | A1* | 3/2014 | Albiez | H01J 37/10 250/307 |
| 2014/0117232 | A1* | 5/2014 | Shachal | H01J 37/28 250/307 |
| 2014/0175278 | A1* | 6/2014 | Ominami | H01J 37/18 250/310 |
| 2015/0206705 | A1* | 7/2015 | Sakuma | H01J 37/20 250/453.11 |
| 2015/0221470 | A1 | 8/2015 | Ominami et al. | |

FOREIGN PATENT DOCUMENTS

| JP | 2013-175376 A | 9/2013 |
| WO | WO 2010/001399 A1 | 1/2010 |

OTHER PUBLICATIONS

Japanese-language Written Opinion (PCT/ISA/237) issued in PCT Application No. PCT/JP2014/056094 dated Apr. 22, 2014 (three pages).
German Office Action issued in counterpart German Application No. 11 2014 003 352.9 dated Feb. 29, 2016 with partial English-language translation (nine (9) pages).

* cited by examiner

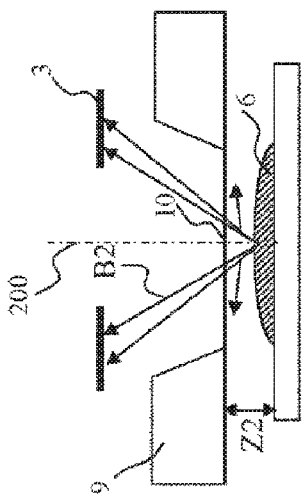
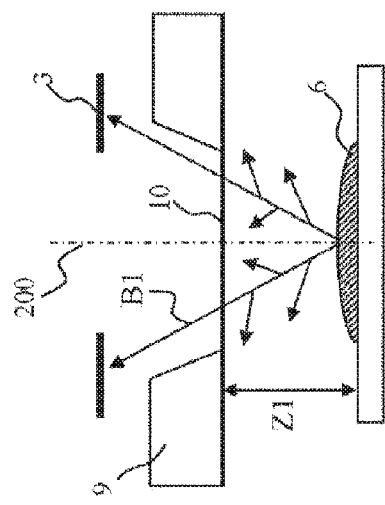
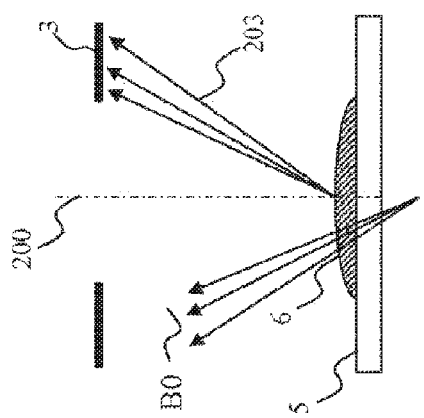
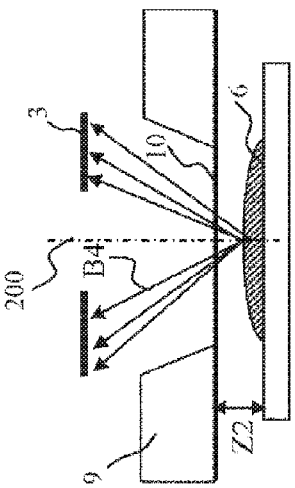
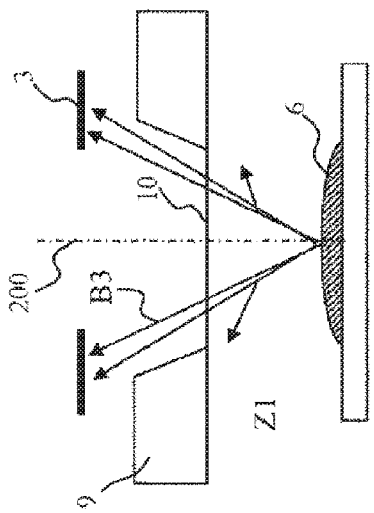

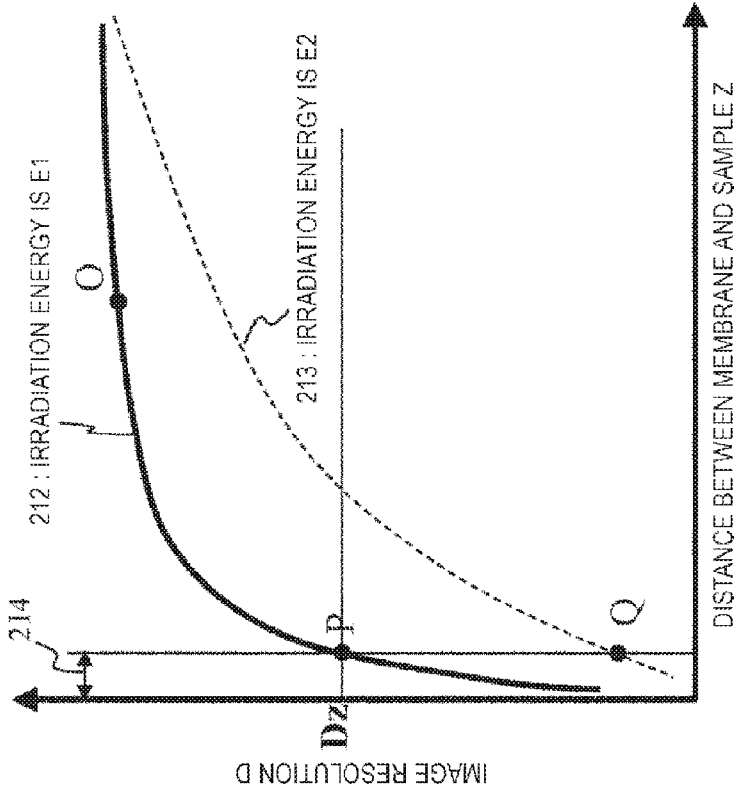
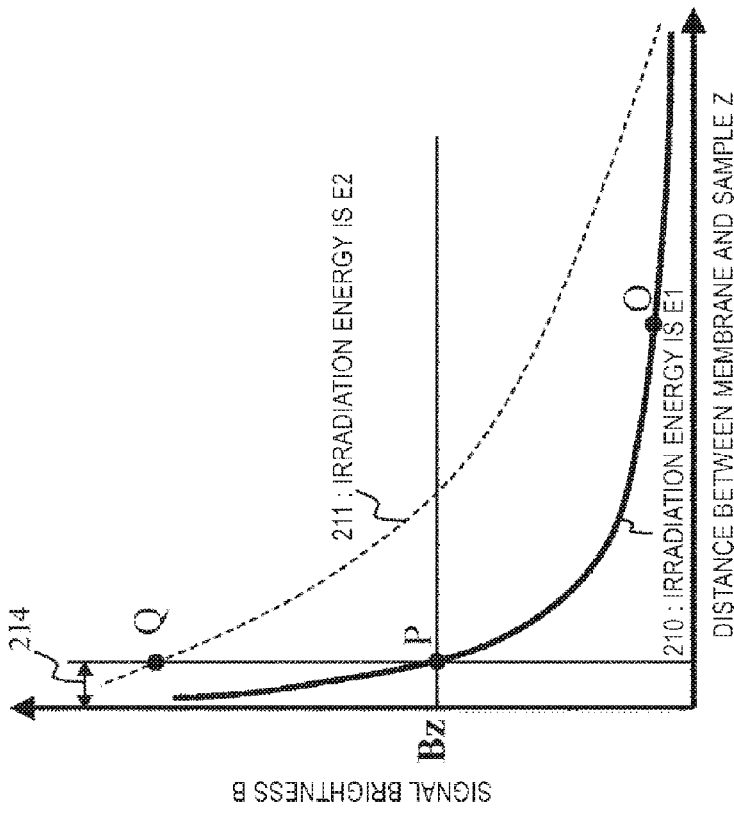
FIG. 4A
FIG. 4B

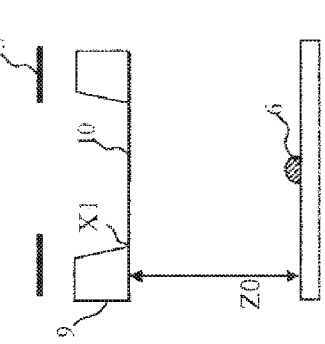
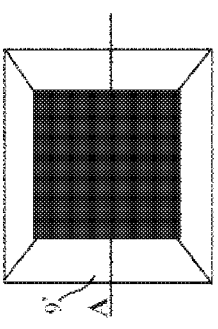
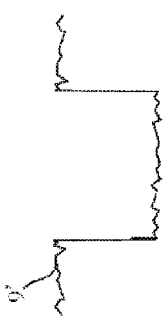
FIG. 5D1　FIG. 5D2　FIG. 5D3
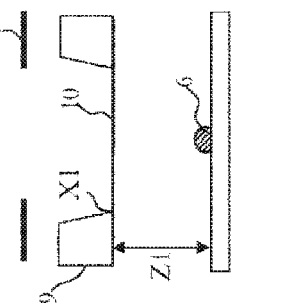
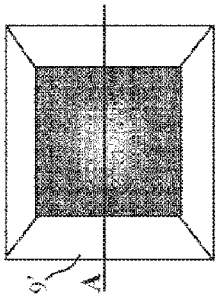
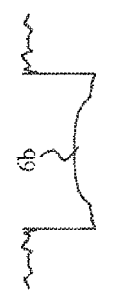
FIG. 5C1　FIG. 5C2　FIG. 5C3
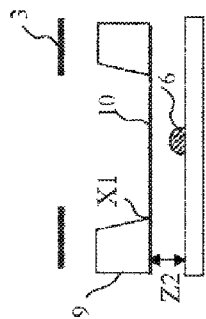
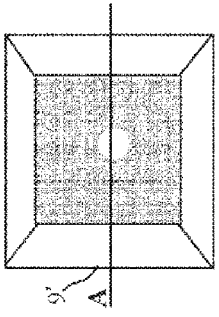
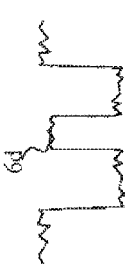
FIG. 5B1　FIG. 5B2　FIG. 5B3
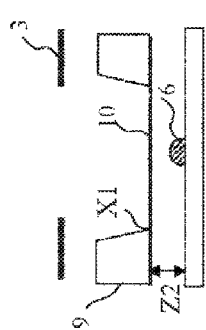
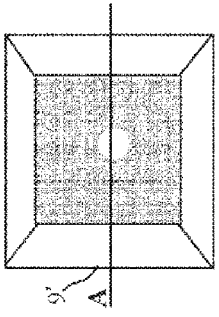
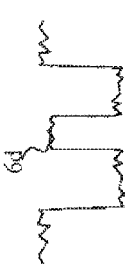
FIG. 5A1　FIG. 5A2　FIG. 5A3

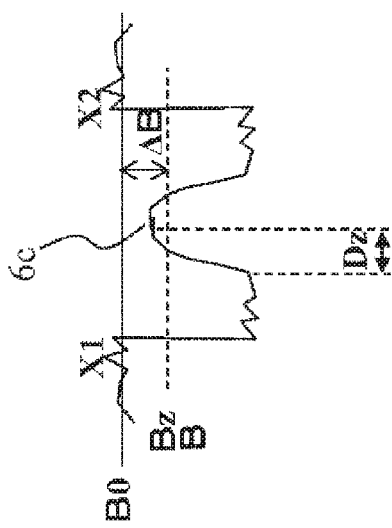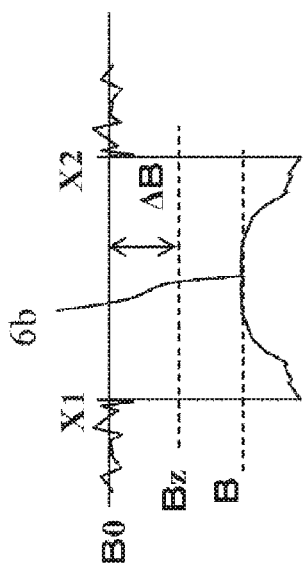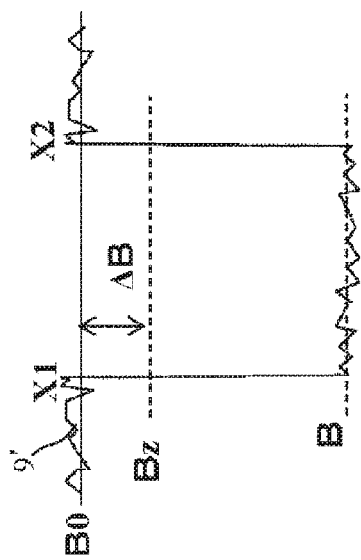

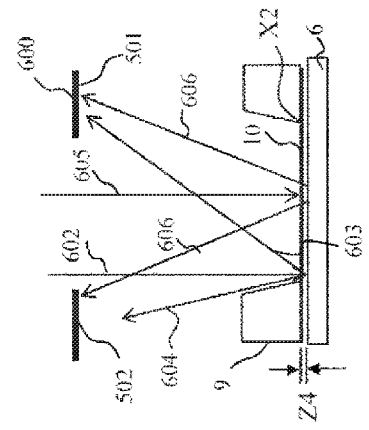
FIG. 9A1
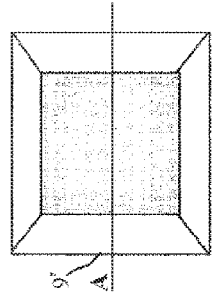
FIG. 9A2
FIG. 9A3
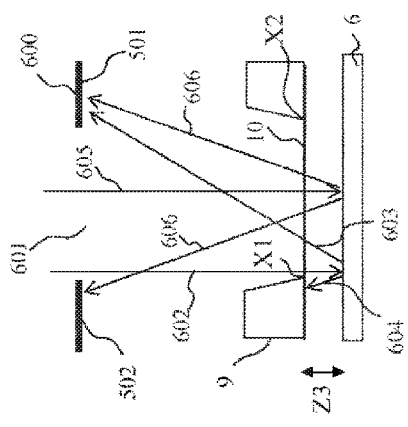
FIG. 9B1
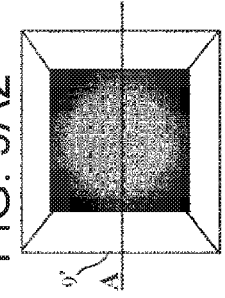
FIG. 9B2
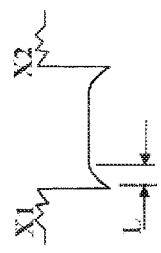
FIG. 9B3

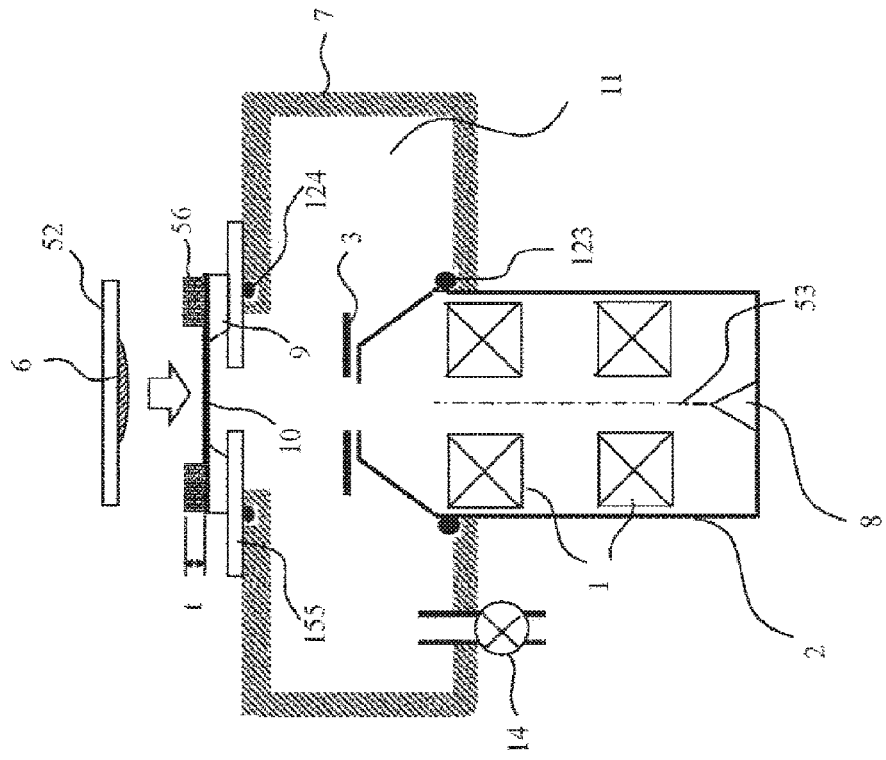
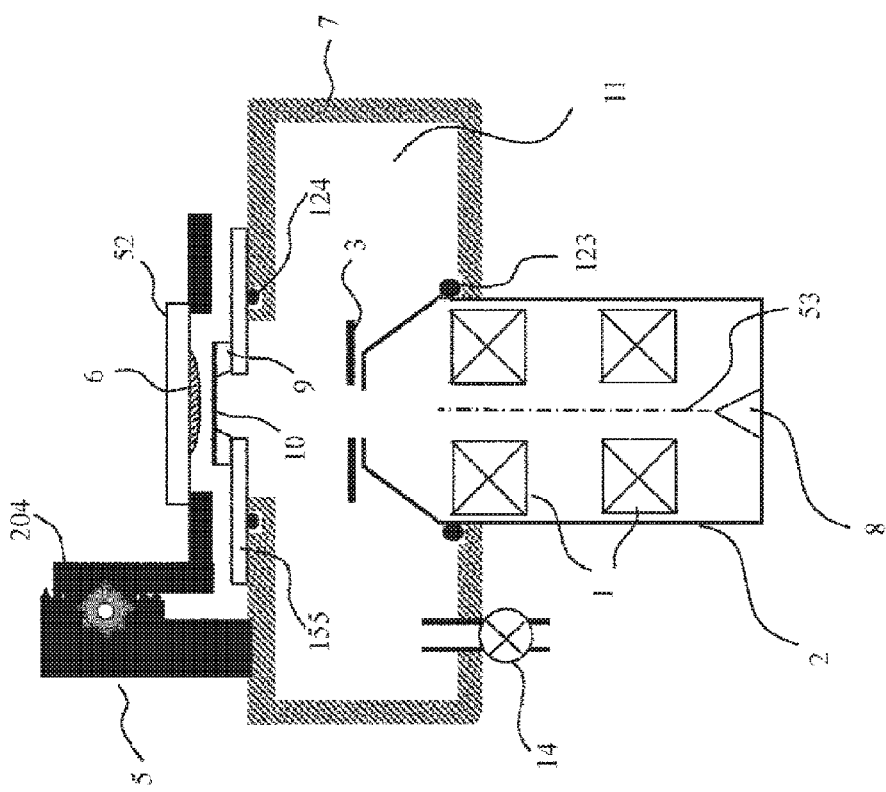

0.1 ATM      0.5 ATM      1.0 ATM

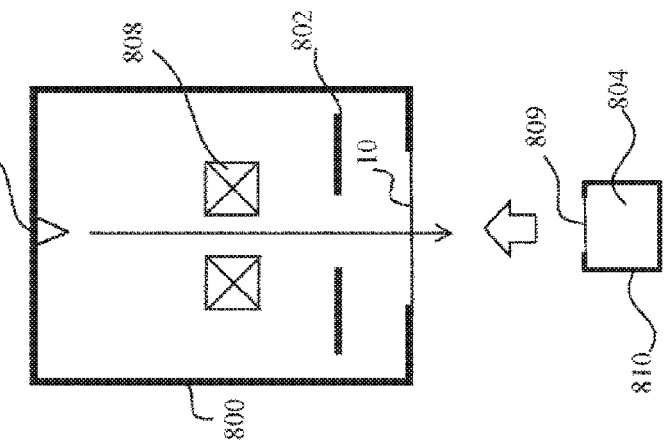
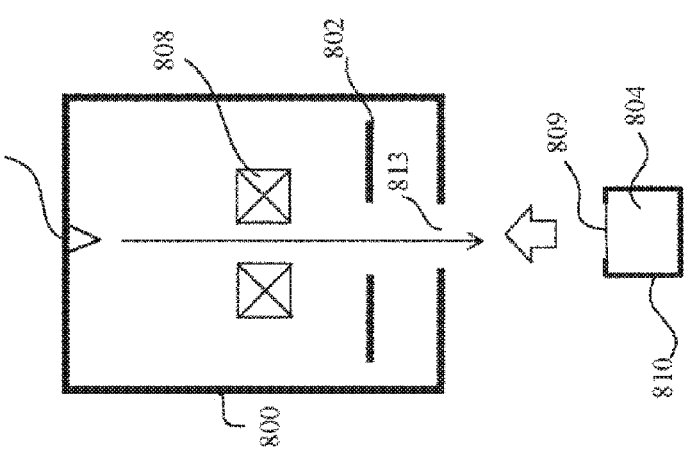
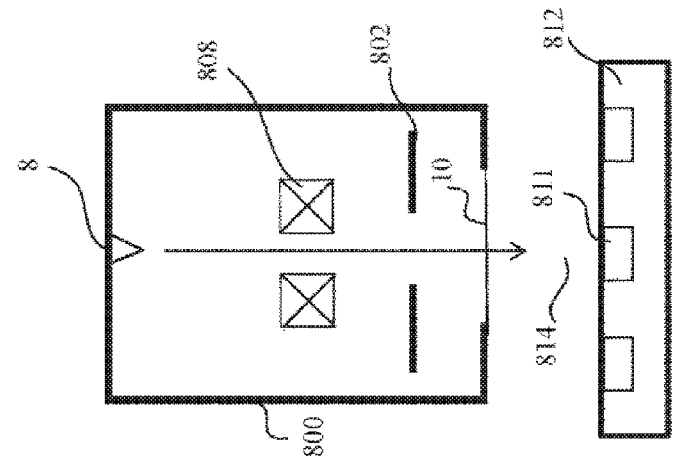

CHARGED PARTICLE BEAM APPARATUS AND SAMPLE IMAGE ACQUIRING METHOD

TECHNICAL FIELD

The present invention relates to a charged-particle beam apparatus that is able to observe a sample under atmospheric pressure or a predetermined pressure of non-vacuum.

BACKGROUND ART

In order to observe a minute area of an object, a scanning electron microscope (SEM), a transmission electron microscope (TEM), or the like is used. Generally, in these apparatuses, a housing is evacuated for disposing a sample, an atmosphere of the sample is in a vacuum state, and then the sample is imaged. However, a biochemical sample, a liquid sample, or the like is damaged by vacuum, or the state thereof is changed. On the other hand, since needs to want to observe are large, such a sample with the electron microscope, the SEM apparatus which is able to observe the sample to be observed under atmospheric pressure, has been strongly desired.

Therefore, in recent years, a SEM apparatus, in which a sample is able to be disposed under atmospheric pressure by partitioning to be a vacuum state and an atmospheric state by providing an electron beam permeable membrane between an electron optical system and the sample, has been disclosed. In the apparatus, in a state where the membrane and the sample do not come into contact with each other by using a sample stage disposed just below the membrane, it is possible to change a sample position and to perform SEM observation under atmospheric pressure.

CITATION LIST

Patent Literature

PTL 1: JP-A-2012-221766

SUMMARY OF INVENTION

Technical Problem

In an apparatus that irradiates the sample disposed under atmospheric pressure with a charged-particle beam in a state where the membrane and the sample do not come into contact with each other, image quality is improved if the membrane and the sample are close to each other. However, if the sample and the membrane are too close to each other, the sample and the membrane come into contact with each other and thereby there is a concern that the membrane is damaged. A method, in which the sample and the membrane do not come into contact with each other by disposing a contact prevention member, of which a thickness is known, between a member maintaining the membrane and the sample, is described in PTL 1. However, since the contact prevention member is disposed outside more than the membrane, if the sample is not flat and is uneven, there is a problem that the contact prevention member cannot prevent damage of the membrane.

The invention is made in view of such a problem and an object of the invention is to provide a charged-particle beam apparatus that is able to observe a sample at atmospheric pressure or a gas atmosphere by adjusting a distance between a membrane and the sample without damaging the membrane, and a sample image acquiring method that uses the apparatus.

Solution to Problem

In order to solve the problem described above, the invention uses a charged-particle beam apparatus including a charged-particle optical column that irradiates a sample with a primary charged-particle beam; a housing that forms a part of the charged-particle beam apparatus and that has an inside thereof which is evacuated by a vacuum pump; a membrane which is able to maintain an airtight state of a space which is evacuated and through which the primary charged-particle beam transmits or passes; and a detector that detects secondary charged-particles that are emitted from the sample by application of the primary charged-particle beam, in which a distance between the sample and the membrane is monitored based on a detection signal that is output from the detector or an image that is generated from the detection signal.

Advantageous Effects of Invention

According to the invention, since the distance between the sample disposed just below the membrane and the membrane can be monitored, it is possible to adjust the distance between the membrane and the sample without contacting the sample disposed under atmospheric pressure, or an atmosphere of a substantially equal pressure, with the membrane.

Problems, configurations, and effects other than the above description will become apparent from the following description of embodiments.

BRIEF DESCRIPTION OF DRAWINGS

FIGS. 3A-3E are an explanatory view of the principle in Example 1.

FIGS. 4A and 4B are an explanatory view of the principle in Example 1.

FIGS. 5A1-5A3, 5B1-5B3, 5C1-5C3, and 5C1-5D3 are an explanatory view of signal detection in Example 1.

FIGS. 6A-6C are an explanatory view of the signal detection in Example 1.

FIGS. 9A1-9A3 and 9B1-9B3 are an explanatory view of the signal detection in Example 1.

FIGS. 16A and 16B are a configuration view of a charged-particle microscope of Example 5.

FIGS. 19A-19C are a configuration view of the charged-particle microscope of Example 6.

Hereinafter, each embodiment will be described with reference to drawings.

Hereinafter, as a charged-particle beam apparatus, a charged-particle beam microscope will be described. However, this is merely an example of the invention and the invention is not limited to the following embodiments. The invention may also be applied to a scanning electron microscope, a scanning ion microscope, a scanning transmission electron microscope, a composite apparatus of these microscopes and a sample processing device, or an analysis and inspection apparatus applying these devices.

In addition, in this specification, "atmospheric pressure" is an air atmosphere or a predetermined gas atmosphere, and means a pressure environment of atmospheric pressure or a slightly negative pressure. Specifically, it is approximately from $10^5$ Pa (atmospheric pressure) to $10^3$ Pa.

EXAMPLE 1

<Apparatus Configuration>

Figure 1:
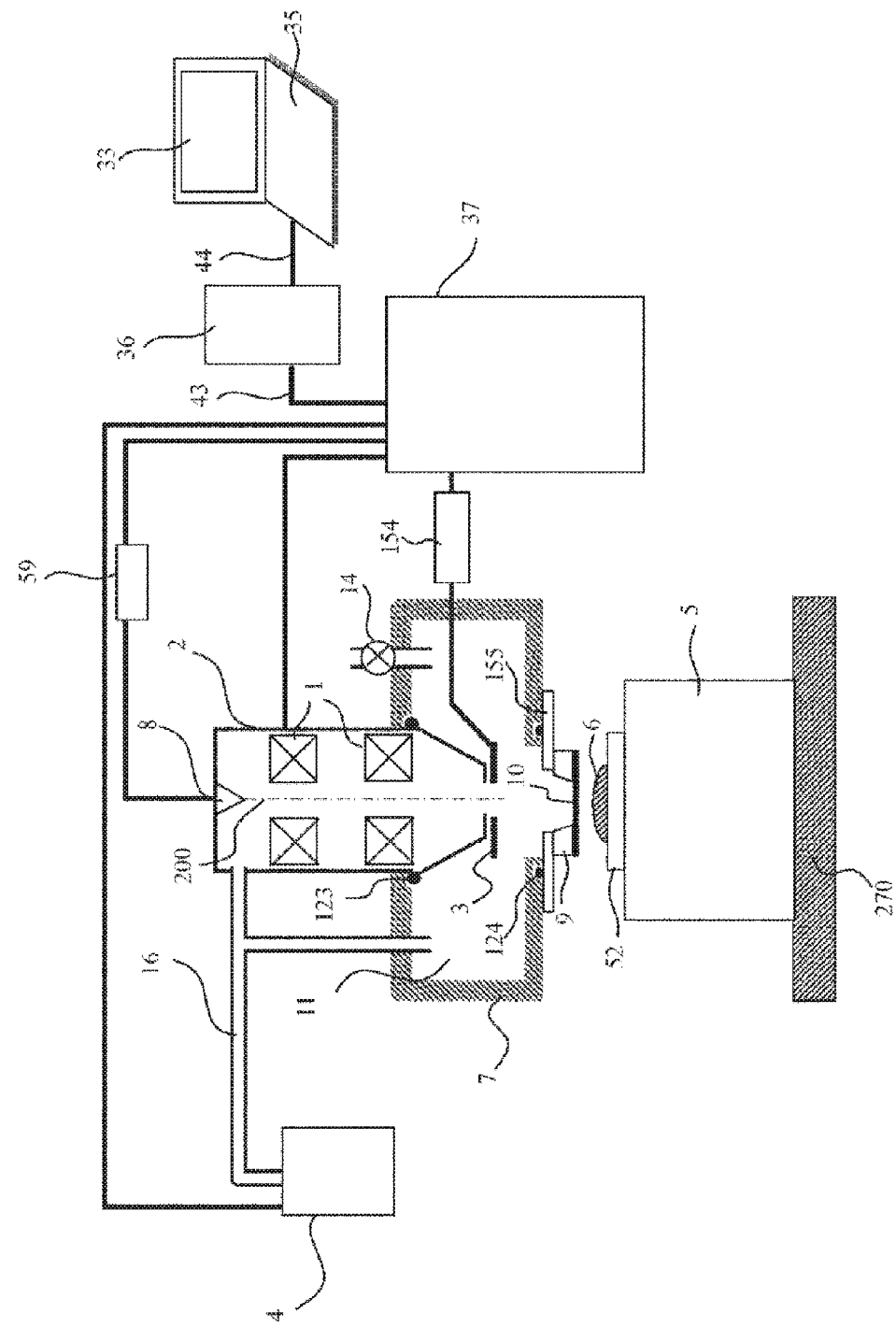
FIG. 1 is an entire configuration view of a charged-particle microscope of Example 1.

In the embodiment, a basic embodiment will be described. FIG. 1 illustrates an entire configuration view of a charged-particle microscope of the example.

The charged-particle microscope illustrated in FIG. 1 is mainly configured of a charged-particle optical column 2, a housing (vacuum chamber) 7 connected to the charged-particle optical column 2, a sample stage 5 disposed under atmosphere pressure, and a control system controlling these members. When using the charged-particle microscope, insides of the charged-particle optical column 2 and the housing 7 are evacuated by a vacuum pump 4. Actuation and stop operation of the vacuum pump 4 are also controlled by the control system. Only one vacuum pump 4 is illustrated in FIG. 1, but two or more vacuum pumps may be provided. The charged-particle optical column 2 and the housing 7 are supported by a pillar or a base (not illustrated).

The charged-particle optical column 2 is configured of elements such as a charged-particle source 8 that generates the charged-particle beam and optical lenses 1 that guide the generated charged-particle beam to the lower portion of the column by focusing the charged-particle beam and scan a sample 6 with a primary charged-particle beam. The charged-particle optical column 2 is disposed so as to protrude to the inside of the housing 7 and is fixed to the housing 7 via a vacuum sealing member 123. A detector 3 that detects secondary charged-particles (secondary electrons or reflected electrons) obtained by application of the primary charged-particle beam is disposed in the end portion of the charged-particle optical column 2. The detector 3 may be provided on an outside or an inside of the charged-particle optical column 2. In addition, other lenses, electrodes, and detectors may be included in the charged-particle optical column, a part of them may be different from the others, and a configuration of a charged-particle optical system included in the charged-particle optical column is not limited to the example.

The charged-particle microscope of the example includes a computer 35 that is used by a user of the apparatus, an upper control section 36 that is connected to the computer 35 and performs communication with the computer 35, and a lower control section 37 that performs controls of a evacuation system, a charged-particle optical system, and the like in accordance with commands transmitted from the upper control section 36 as a control system. The computer 35 includes a monitor 33 on which an operation screen (GUI) of the apparatus is displayed and an input unit such as a keyboard and mouse to the operation screen. The upper control section 36 is connected to the lower control section 37 and the computer 35 by each of communication lines 43 and 44.

The lower control section 37 is a portion that transmits and receives control signals for controlling the vacuum pump 4, the charged-particle source 8, the optical lenses 1, and the like, and transmits output signals of the detector 3 to the upper control section 36 by converting the output signals into digital image signals. An image generated by the upper control section 36 is displayed on the monitor 33 of the computer 35. In the view, the output signal from the detector 3 is connected to the lower control section 37 via an amplifier 154 such as a preamplifier. If the amplifier is not necessary, the amplifier may not be provided.

In the upper control section 36 and the lower control section 37, analog circuits, digital circuits, and the like may be mixed. The upper control section 36 and the lower control section 37 may be integrated. In addition, a control section that controls an operation of each portion may be included in the charged-particle microscope. The upper control section 36 or the lower control section 37 may be configured of hardware by a dedicated circuit substrate or may be configured of software that is executed by the computer 35. When being configured of the hardware, it is possible to realize the hardware by integrating a plurality of the calculators executing processing on a wiring substrate, or within a semiconductor chip or a package. When being configured of the software, it is possible to realize the software by executing a program that executes a desired calculation processing by mounting a high-speed general-purpose CPU to the computer. Moreover, the configuration of the control system illustrated in FIG. 1 is merely an example and modification examples of a control unit, a valve, the vacuum pump, communication wiring, and the like belong to the category of design of the SEM and the charged-particle beam apparatus of the example, as long as functions intended in the example are satisfied.

A vacuum pipe 16, an end of which is connected to the vacuum pump 4, is connected to the housing 7 and the inside thereof can be maintained in a vacuum state. Simultaneously, a leakage valve 14 for opening the inside of the housing to the atmosphere is provided and the leakage valve 14 can open the inside of the housing 7 to the atmosphere during maintenance and the like. The leakage valve 14 may be not provided or may be two or more. In addition, an arrangement position of the leakage valve 14 in the housing 7 is not limited to the portion illustrated in FIG. 1 and may be arranged in another position on the housing 7.

A membrane 10 is provided in a position just below the charged-particle optical column 2 on a lower surface of the housing. The membrane 10 is able to cause the primary charged-particle beam emitted from a lower end of the charged-particle optical column 2 to transmit or pass and the primary charged-particle beam finally reaches the sample 6 mounted on a sample stage 52 through the membrane 10. A closed space (that is, insides of the charged-particle optical column 2 and the housing 7) configured of the membrane 10 is able to be evacuated. Since the sample is disposed in a non-vacuum space, the membrane 10 is necessary for maintaining differential pressure between a vacuum space and the non-vacuum space. In the example, since an airtight state of the space evacuated by the membrane 10 is maintained, it is possible to maintain the charged-particle optical column 2 in the vacuum state and to observe the sample 6 by maintaining the sample 6 at atmospheric pressure. In addition, even in a state where the charged-particle beam is applied, since the space in which the sample is disposed is in the air atmosphere or communicates with a space of the air atmosphere, the sample 6 can be freely exchanged during observation.

The membrane 10 forms a film or is deposited on a base 9. The membrane 10 is a carbon material, an organic material, a metal material, silicon nitride, silicon carbide, silicon oxide, and the like. The base 9 is, for example, a member such as silicon or a metal member. The membrane 10 may be a plurality of arranged multi-windows. A thickness of the membrane through which the primary charged-particle beam can be transmitted or can pass is approximately several nm to several μm. It is necessary for the membrane to not be damaged by the differential pressure for separating atmospheric pressure and the vacuum. Thus, an area of the membrane 10 has an area with a maximum size of approximately several tens of μm to several mm at largest. A shape of the membrane 10 may be a rectangular and the like in addition to a square. The shape is arbitrary. A base for manufacturing the membrane 10 is silicon and if a membrane material is formed as a film on silicon and then wet etching is processed, areas are different in an upper portion and a lower portion of the membrane as illustrated in the view. That is, an opening area of the base 9 on the upper side is greater than the membrane area in the view.

The base 9 supporting the membrane 10 is provided on a membrane maintaining member 155. Although not illustrated, the base 9 and the membrane maintaining member 155 are adhered by O-ring, gasket, adhesive, double-sided tape, and the like by which vacuum seal can be performed. The membrane maintaining member 155 is fixed to a lower surface of the housing 7 via a vacuum sealing member 124 to be detachable. Since the membrane 10 is very thin the thickness of which is approximately several nm to several μm on the request to cause the charged-particle beam to transmit the membrane, the membrane may be damaged due to temporal deterioration or during observation preparation. In addition, since the membrane 10 and the base 9 supporting the membrane 10 are small, direct handling is very difficult. Thus, as the example, the membrane 10 and the base 9 are integrated with the membrane maintaining member 155 and the base 9 can be handled via the membrane maintaining member 155 without direct handling. Thus, handling (particularly, replacement) of the membrane 10 and the base 9 becomes very easy. That is, if the membrane 10 is damaged, the membrane maintaining member 155 may be replaced. Even if the membrane 10 has to be directly replaced, the membrane maintaining member 155 is removed to an outside of the apparatus and the base 9 that is integrated with the membrane 10 can be replaced on the outside of the apparatus.

In addition, although not illustrated, an optical microscope that is able to observe the sample may be disposed just under the sample 6 or in the vicinity of the sample 6. In this case, the membrane 10 is positioned on an upper side of the sample and the optical microscope observes the sample from below the sample. Thus, in this case, the sample stage 52 is necessary to be transparent with respect to light of the optical microscope. As a transparent material, there are transparent glass, transparent plastic, a transparent crystal body, and the like. As more general sample stage, there is a transparent sample stage such as slide glass (or preparation) and dish (or petri dish).

In addition, a temperature heater, a voltage applying section that is able to generate an electric field in the sample, and the like may be provided. In this case, it is possible to observe an aspect in which the sample is heated or cooled and an aspect in which the electric field is applied to the sample.

In addition, the membrane may be disposed two or more. For example, the membrane may be provided on the inside of the charged-particle optical column 2. Otherwise, a second membrane is provided below a first membrane separating the vacuum and the atmosphere and the sample may be included between the second membrane and the sample stage. In this case, the invention may be applied described below when the second membrane approaches the first membrane.

In addition, an environmental cell, which can be introduced into an inside of a vacuum device in a state where the entirety of the sample is included, may be provided as the sample. For example, a sample height adjustment mechanism is included in an inside of the environmental cell and the invention described below can be applied even if the sample approaches the membrane separating the vacuum and the atmosphere. In the invention, the number and type of the membrane are not limited and belong to the category of the SEM or the charged-particle beam apparatus of the example, as long as they fulfill the intended function in the example.

In addition, although not illustrated, a detector that detects the charged-particle beam transmitting the sample 6 may be disposed just below the sample 6. The detector is a detection element that can detect and amplify the approaching charged-particle beam with energy of from several keV to several tens of keV. For example, a semiconductor detector that is made of a semiconductor material such as silicon, a scintillator that can convert a charged-particle signal into a light on a glass surface or an inside thereof, a luminescent light emitting material, a yttrium aluminum garnet (YAG) element, and the like are used. An electrical signal or an optical signal from the detector is transmitted to the control system configured of the upper control section 36 or the lower control section 37 via wiring, a light transferring path, a light detector, or the like. It is possible to detect a transmission charged-particle signal in the transmission charged-particle beam from the detector on which the sample is directly mounted. The detector on which the sample 6 is mounted approaches the membrane 10 separating the vacuum from the atmosphere and thereby it is possible to acquire a transmission charged-particle beam image of the sample 6 in the atmosphere. In this case, in an approaching method of the sample 6 on the detector and the membrane 10, a method described below can be applied.

The sample stage 5 disposed under atmosphere pressure is provided in a lower portion of the membrane 10 included in the housing 7. A Z-axis driving mechanism having a height adjusting function that is able to cause at least the sample 6 to approach the membrane 10 is provided in the sample stage 5. Of course, an X-Y driving mechanism moving in a direction of a sample surface may be provided. Moreover, although not illustrated, as a mechanism that adjusts the distance between the sample 6 and the membrane 10, a driving mechanism that drives the membrane 10 and the membrane maintaining member 155 in a direction of the sample (upward and downward direction in the view) may also be provided in addition to or instead of the Z-axis driving mechanism moving the sample 6. Those mechanisms changing the distance between the membrane and the sample by moving the membrane or the sample are collectively referred to as the distance adjustment mechanism.

In the example, energy E when the charged-particle beam reaches the sample from the charged-particle beam source 8 is set and controlled. An irradiation energy control section 59 is provided between the lower control section 37 and the charged-particle optical column 2. The irradiation energy control section 59 is a high voltage power supply and the like that is able to change at least two conditions of the irradiation energy E of the charged-particle beam to the sample by changing a voltage supplied, for example, to the charged-particle beam source 8. The irradiation energy control section 59 may be provided on the inside of the lower control section 37. In addition, as another example, the irradiation energy control section 59 may be an electrode that changes an acceleration voltage of the charged-particle beam from the charged-particle beam source or a power supply that variably controls a voltage to an optical lens that is able to accelerate or decelerate the charged-particle beam before the charged-particle beam is applied to the sample. As still another example, it may be a power supply that can apply a voltage to the sample stage. Such a control system may also be provided on the inside of the lower control section 37 or may be provided between the lower control section 37 and the optical lens 1. In addition, a specific example of the irradiation energy control section of the charged-particle beam described above may be used in combination appropriately.

<Principle Description>

A principle used to obtain a positional relationship between the sample and the membrane, by enabling setting the irradiation energy of the primary charged-particle beam to at least two levels of irradiation energy, and a result thereof will be described below. In the following description, the irradiation energy of the primary charged-particle beam is E1 when adjusting the distance between the membrane and the sample, and the irradiation energy of the primary charged-particle beam is E2 when acquiring an observation image by scanning the sample with the primary charged-particle beam. Moreover, as described below, even when adjusting the distance between the membrane and the sample, image acquisition is performed. In a case of an image for adjusting, a low image quality may be provided as described below, and it is sufficient, as long as it has image quality capable of acquiring parameters. On the other hand, an image that is acquired during observation is an image that is an object to be observed ultimately, or stored by a user, and is generally desired to be high quality.

Figure 2A:
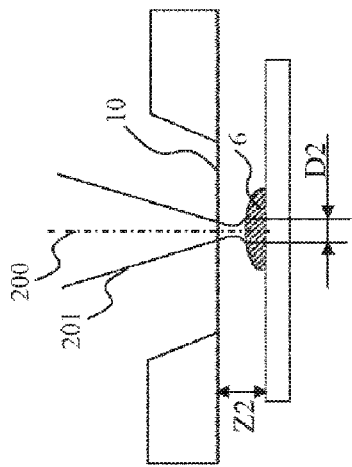
FIGS. 2A-2E are an explanatory view of a principle in Example 1.

First, a beam diameter D when the charged-particle beam reaches the sample will be described with reference to FIG. 2. As illustrated in FIG. 2(a), if the membrane 10 is not present and a space in which the sample is mounted is in the vacuum state, a primary charged-particle beam 201 reaches the sample 6 in a state where the primary charged-particle beam 201 is focused by a charged-particle optical system such as the optical lens 1 and the like. In this case, when the beam diameter of the primary charged-particle beam 201 is D0, the beam diameter D0 is determined by lens aberration of the optical lens 1 and the like. On the other hand, as illustrated in FIGS. 2(b) to 2(e), if the space in which the sample is mounted is a gas atmosphere such as that of atmospheric pressure, the beam diameter when the primary charged-particle beam 201 reaches the sample depends on a distance Z between the membrane 10 and the sample 6, and the irradiation energy E.

Figure 2B:
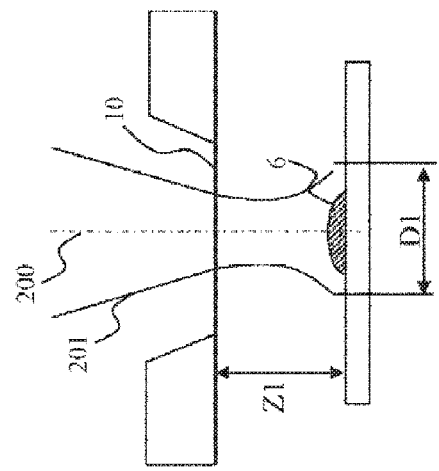
Figure 2C:
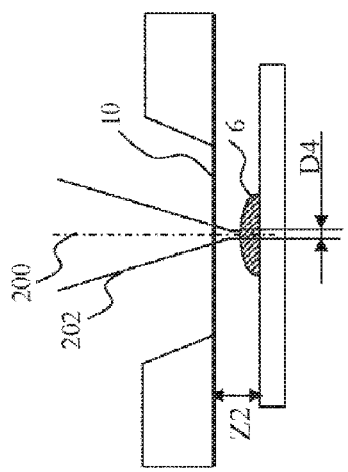
Figure 2D:
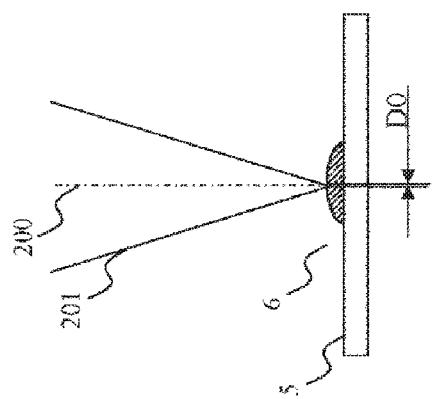
Figure 2E:
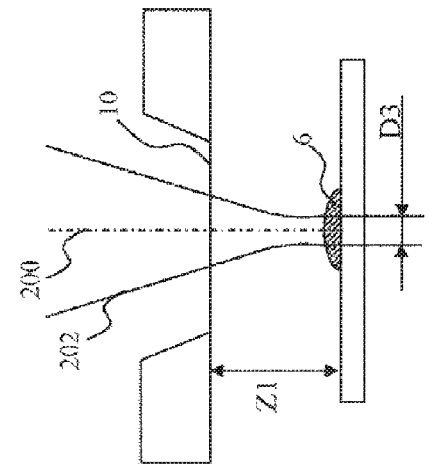

FIG. 2(b) illustrates a case where the charged-particle beam is applied to the sample 6 by the irradiation energy E1 when the distance from the membrane 10 is Z1, FIG. 2(c) illustrates a case where the charged-particle beam is applied to the sample 6 by the irradiation energy E1 when the distance from the membrane 10 is Z2, FIG. 2(d) illustrates a case where the charged-particle beam is applied to the sample 6 by the irradiation energy E2 when the distance from the membrane 10 is Z1, and FIG. 2(e) illustrates a case where the charged-particle beam is applied to the sample 6 by the irradiation energy E2 when the distance from the membrane 10 is Z2. In addition, the following Expressions are satisfied between E1 and E2, and Z1 and Z2.

$$E1 < E2 \quad \text{(Expression 1)}$$

$$Z1 > Z2 \quad \text{(Expression 2)}$$

In FIG. 2(b), the irradiation energy E1 is relatively small and the distance Z1 is relatively long. Thus, the charged-particle beam is scattered by the atmosphere or gas under a desired gas pressure between the membrane 10 and the sample 6 until the charged-particle beam reaches the sample 6 and the beam diameter is greater than D0 as indicated by D1 of the view. If a size of the observation object of the sample 6 is smaller than the beam diameter D1, the observation object cannot be identified in the image. In FIG. 2(c), the distance between the membrane 10 and the sample 6 is shortened to Z2, since the number of times or probability that the charged-particle beam is scattered by the atmospheric pressure or gas under a desired gas pressure is reduced, the beam diameter D2 can be smaller than D1. As a result, the observation object of the sample 6 can be identified in the image. That is, if the distance between the membrane 10 and the sample 6 is closer as much as possible, it is possible to increase resolution of the image. On the other hand, in FIG. 2(d), since the irradiation energy E2 of a primary charged-particle beam 202 is relatively large, even if the distance between the membrane 10 and the sample 6 is Z1, a beam diameter D3 of the primary charged-particle beam 202 can be in a state of being small compared to D1. Thus, even in a case of the distance Z1, the observation object of the sample 6 can be identified in the image. In addition, as illustrated in FIG. 2(e), if the distance between the membrane 10 and the sample 6 is shortened to Z2, the beam diameter can be a beam diameter D4 that is further small and it is possible to observe the sample 6 in resolution higher than that of the case of FIG. 2(d).

That is, if the irradiation energy E is high, the observation object of the sample 6 can be identified even if the distance Z is great, but if it is desired that the observation is performed in higher resolution, the distance between the membrane 10 and the sample 6 is preferably shortened. As described above, if the distance between the membrane 10 and the sample 6 is shortened as much as possible, the image quality becomes improved.

When considering the viewpoint described above, if observation is performed only in the irradiation energy E2, it may be said that it is difficult to recognize whether or not the distance between the membrane 10 and the sample 6 is in a certain degree based on the charged-particle beam image. That is, if observation is performed with the irradiation energy E2, there is a problem that distance is not ascertained. If the sample 6 approaches the membrane 10 in the sample stage 5 in a state where the distance between the membrane 10 and the sample 6 is not known, the sample 6 excessively approaches the membrane 10 and comes into contact with the membrane 10, and, as a result, the membrane 10 may be damaged.

Next, a case where secondary charged-particles reach the detector 3 from the sample will be described with reference to FIG. 3. The primary charged-particle beam reaching the sample 6 causes the secondary charged-particles such as reflected charged-particles or second charged-particles to be generated, the secondary charged-particles reach the detector 3, and thereby the secondary charged-particles are detected as a microscope image. The secondary charged-particles capable of reaching the detector 3 via the air space and the membrane 10 are the charged-particle beam that maintains high energy, that is, the charged-particle beam that is elastically scattered or slightly inelastically scattered. When energy of an incident charged-particle beam is E and energy of the secondary charged-particles is E', the following is satisfied.

$$E' \approx E \qquad \text{(Expression 3)}$$

That is, as the incident energy E is increased, the energy E' of the secondary charged-particles is also increased. As illustrated in FIG. 3(a), a case where the membrane 10 is not present and the space in which the sample is mounted is in the vacuum state may be considered. In this case, secondary charged-particles 203 reach the detector 3 without being scattered. An amount of the secondary charged-particles reaching the detector is B0. In this case, the secondary charged-particles emitted from the sample can reach the detector 3 without being scattered because a vacuum is present between the sample 6 and the detector 3.

On the other hand, as illustrated in FIGS. 3(b) to 3(e), if the space in which the sample is mounted is a gaseous atmosphere such as that of atmospheric pressure, the amount of secondary charged-particles 203 reaching the detector 3 depends on the distance between the sample 6 and the membrane 10. FIG. 3(b) illustrates a case where the charged-particle beam is applied to the sample 6 of which the distance from the membrane 10 is Z1 by the irradiation energy E1, FIG. 3(c) illustrates a case where the charged-particle beam is applied to the sample 6 of which the distance from the membrane 10 is Z2 by the irradiation energy E1, FIG. 3(d) illustrates a case where the charged-particle beam is applied to the sample 6 of which the distance from the membrane 10 is Z1 by the irradiation energy E2, and FIG. 3(e) illustrates a case where the charged-particle beam is applied to the sample 6 of which the distance from the membrane 10 is Z2 by the irradiation energy E2. Here, the relationships indicated by (Expression 1) and (Expression 2) are satisfied between E1 and E2, and Z1 and Z2. In FIG. 3(b), the irradiation energy E1 is relatively small and the distance Z1 is relatively long. Thus, until the secondary charged-particles reach the detector 3, the secondary charged-particles are scattered by gas under atmosphere or a desired gas pressure between the membrane 10 and the sample 6, and an amount B1 of the secondary charged-particles that actually reach the detector 3 is smaller than B0. For example, the secondary charged-particles emitted from the sample are also scattered in a direction other than the direction of the membrane 10 and the detector 3. Furthermore, a beam receiving inelastic scattering by gas under atmospheric pressure or a desired gas pressure between the membrane 10 and the sample 6 is also included in the amount B1 of the secondary charged-particles. For these reasons, the energy E' of the secondary charged-particles reaching the detector 3 is decreased and the amount of the secondary charged-particles of the energy E that are elastically scattered is decreased to less than B1. Sensitivity or the amplification rate of the detector 3 such as the semiconductor element or the scintillator for detecting the charged-particle beam generally depends on energy of the incident charged-particle beam. As a result, if the microscope image of the sample 6 is acquired in a state of FIG. 3(b), brightness of the detected image becomes very dark compared to FIG. 3(a). The reason is that the number of the secondary charged-particles reaching the detector 3 is decreased by being scattered by gas under the atmosphere or a desired gas pressure and the amplification rate of the detector 3 is reduced.

On the other hand, as illustrated in FIG. 3(c), when decreasing the distance between the membrane 10 and the sample 6 to Z2, the number of times or probability to be scattered by gas under atmospheric pressure or a desired gas pressure is reduced. Thus, it is possible to increase the amount B2 of the detected secondary charged-particles more than B1. As a result, it is possible to recognize that the sample 6 approaches the membrane by the brightness of the image. In FIG. 3(d), since the irradiation energy E2 of the primary charged-particle beam 202 is relatively large, even if the distance between the membrane 10 and the sample 6 is Z1, the amount B3 of the secondary charged-particles is in a state of being greater than B1. In addition, as illustrated in FIG. 3(e), if the distance between the membrane 10 and the sample 6 is decreased to Z2, since the secondary charged-particles B4 can be greater than B3, the image of the sample 6 can be clearer.

When considering the viewpoint described above, if the irradiation energy E is high, even if the distance Z is changed, the secondary charged-particles can reach the detector 3 from the sample 6, it may be said that the distance Z is difficult to be obtained based on the image. On the other hand, if it is desired to perform the observation at a higher resolution and the like, the image quality is improved as the distance between the membrane 10 and the sample 6 is as close as possible. Thus, it is preferable that the distance between the membrane 10 and the sample 6 is short. Thus, as described above with reference to FIG. 2, also for the secondary charged-particles, if the observation is performed only by the irradiation energy E2, it is difficult to recognize whether the distance between the membrane 10 and the sample 6 is a certain degree based on the charged-particle beam image. That is, in a state where the distance between the membrane 10 and the sample 6 is not known, if the sample 6 approaches the membrane 10 in the sample stage 5, the sample 6 excessively approaches the membrane 10 and comes into contact with the membrane 10, and, as a result, the membrane 10 may be damaged.

Then, in the example, in a state of the irradiation energy E1, only a case where the distance between the membrane 10 and the sample 6 is sufficiently close utilizes that the observation object of the sample 6 can be identified. That is, in a state of the irradiation energy E1, image acquisition is started (FIG. 2(b) or 3(b)). Next, the distance between the membrane 10 and the sample 6 is gradually shortened and if the observation object of the sample 6 is identified, (FIG. 2(c) or 3(c)), it changes to E2 that is a stronger irradiation energy, and the observation is performed at a higher resolution (FIG. 2(e) or 3(e)). As a result, it is possible to make the sample very simply approach the membrane compared to a method of shortening the distance between the membrane 10 and the sample 6 only with the image acquired by the irradiation energy E2.

The above description will be described in detail with reference to FIG. 4. FIG. 4(a) illustrates a relationship between the distance Z between the membrane and the sample and signal brightness B. FIG. 4(b) illustrates a relationship between the distance Z between the membrane and the sample and image resolution D. The image resolution D is an amount corresponding to the beam diameter and in the following description, the image resolution and the beam diameter may be handled as an equal parameter. In a case of the irradiation energy E2, if the distance is close, the signal brightness B and the image resolution (or the beam diameter) D are gradually reduced (curve indicated by a dotted line in the view). In a case of the irradiation energy E1, if the distance between the membrane and the sample is not sufficiently close, the signal brightness B and the image resolution (or the beam diameter) D are not improved. In the example, with the use of the principle the distance between the membrane and the sample is adjusted by using a point in which the image quality of the image acquired in the state of the irradiation energy E1 is sharper. The point, at which the image quality is sharper, is a point at which a shape or a surface shape of the sample 6 begins to appear sharp because the number of times that the primary charged-particle beam is scattered is very low, that is, a size of the shape configuring the sample 6 and the beam diameter of the primary charged-particle beam substantially match each other. As illustrated in FIG. 4, since signal brightness or the image resolution with respect to the distance between the membrane and the sample is continuously changed, if the membrane and the sample are continuously close, a detection rate of the signal due to the sample is precisely and continuously changed. However, also in this case, as described below with reference to FIGS. 5 to 7, a threshold of the signal brightness or the image resolution, with which a user or a computer can recognize the shape of the sample in the image, is present. The threshold is expressed as the point at which the image is sharply better. For example, if determination is performed by the computer, it is the point in which the image is sharper in a state where a significant amount of the signal due to the sample is detected with respect to a signal of a background. In addition, if the distance between the membrane and the sample is stepwise close, the sample image cannot be recognized in a certain distance Z1 and a state where the sample image can be recognized is present in Z2 that is closer than Z1. In this case, the point in which the image quality is sharper means a state corresponding to Z2.

That is, the point in which the image quality is sharply better is the threshold (signal brightness: Bz and the image resolution Dz) and then approaching of the sample and the membrane is performed until the threshold is reached. That is, when the sample and the membrane being positioned at a separated position is a 0 point, the distance Z between the membrane and the sample is close until the signal brightness or the image resolution becomes a certain threshold (signal brightness: Bz and the image resolution Dz in the view). A state where the distance is close to reach the threshold is indicated as the P point in the view. In this state, if the irradiation energy is changed from E1 to E2 while fixing the distance Z, the signal brightness B and the image resolution D are in a state of being indicated by a Q point in the view and the image quality is significantly improved.

More specifically, a case where E1 is 5 kV and E2 is 15 kV will be described. In addition, the distance between the membrane and the sample at the 0 point is 50 μm. In a theoretical calculation result of a mean free path (distance that can precede without colliding with an atmospheric component) in which the charged-particle beam is the electron beam and air component is considered to be present 1 atm between the membrane and the sample, the mean free path of the electron beam is approximately 15 μm when the irradiation energy is 5 kV and the mean free path of the charged-particle beam is approximately 50 μm when the irradiation energy is 15 kV. That is, when the irradiation energy E1 is 5 kV, if the distance between the membrane and the sample is reduced from 50 μm that is the 0 point to approximately 15 μm or less that is the mean free path in 5 kV, it reaches the P point in which the image quality is sharper and the image of the sample is started to be looked at. Thereafter, if the irradiation energy is changed to 15 kV, in a state where the distance between the membrane and the sample is 15 μm, it is possible to irradiate the sample with the electron beam by the irradiation energy of 15 kV in the mean free path of 50 μm. Thus, it reaches the Q point in which the image quality is further improved and it is possible to obtain the image in which scattering of the charged-particle beam is considerably reduced.

Here, an aspect that determination of whether or not the threshold is reached is obtained from an image change will be described with reference to FIG. 5. Moreover, as illustrated in FIG. 5, the brightness information or the resolution information described above can also be obtained from a profile of the detection signal or the brightness or the resolution can also be obtained by the image that is generated from the detection signal. Thus, parameters such as the brightness, the resolution, and the like for monitoring the distance between the membrane and the sample may be directly acquired from the detection signal or may be recognized from the image. FIG. 5(a1) is a schematic sectional view in a case where the distance between the membrane 10 and the sample 6 is Z0, FIG. 5(a2) is an explanatory view of the microscope image acquired by the detector 3 in FIG. 5(a1), and FIG. 5(a3) is a line profile of image brightness of line A of FIG. 5(a2). FIGS. 5(a) to 5(c) are an example in which irradiation is performed by the irradiation energy E1 and FIG. 5(d) is an example in which irradiation is performed by the irradiation energy E2 that is greater than E1.

In a case where the distance between the membrane 10 and the sample is Z0 that is relatively large, since the secondary charged-particles are not returned from a lower surface of the membrane 10, as illustrated in FIG. 5(a2), the membrane 10 portion appears dark in the image and only the secondary charged-particles from the base 9 are acquired by the detector 3. Thus, as illustrated in FIG. 5(a2), a base 9' in an upper region of the membrane 10 is observed as the microscope image. In addition, in this case, the line profile is formed as illustrated in FIG. 5(a3).

Next, as illustrated in FIG. 5(b1), if the distance between the membrane 10 and the sample 6 is Z1 that is closer than Z0, the secondary charged-particles are returned from the lower surface of the membrane 10 to some extent. Thus, as illustrated in FIG. 5(b2), the microscope image of the sample 6 can recognize that the sample 6 is present below the membrane 10. However, as illustrated in FIG. 2, since the beam diameter is large and the secondary charged-particles reaching the detector 3 are small, as illustrated in the line profile of FIG. 5(b3), the microscope image of the sample 6 is looked at to an extent of blurred dark. This is indicated by a signal 6b. Next, as illustrated in FIG. 5(c1), in a case where the distance between the membrane 10 and the sample 6 is Z2 that is closer than Z1, the secondary charged-particles are incident on the sample 6 in a state where the beam diameter is small and most of the secondary charged-particles are detected by the detector 3. Thus, the microscope image of the sample 6 is provided as illustrated in FIG. 5(c2) and it is possible to observe the microscope image of the sample 6 over the membrane 10. Also in FIG. 5(c3) of the line profile of the image brightness of the line A, the sample 6 can be looked at to some extent. Finally, if the irradiation energy is E2 while maintaining the positional relationship between the membrane and the sample of FIG. 5(c1), as described above, the beam diameter is further reduced when reaching the sample 6 and the secondary charged-particles reaching the detector 3 are further increased. Thus, as illustrated in FIGS. 5(d2) and 5(d3), the signal of the sample 6 is a signal 6d and it is possible to very slowly perform the observation. That is, as the image is in the state of FIG. 5(c2) and the line profile is in the state of FIG. 5(c3), if a state where the observation object is looked at in the image is identified in the state of the irradiation energy E1, it is possible to determine that the distance between the membrane 10 and the sample 6 is in a state of approaching to Z2 that is an appropriate distance for the observation.

More specifically, if the irradiation energy is approximately from 1 kV to 50 kV, the irradiation energy E and the mean free path $\lambda$ substantially satisfy the following relationship.

$$\lambda \propto E \qquad \text{(Expression 4)}$$

That is, if the irradiation energy E is three times, the mean free path is substantially three times. In the example, in order to execute a method of changing the irradiation energy E, it is preferable that a ratio between E1 and E2 is large as much as possible and, for example, the E2/E1 ratio may be approximately 2 times or more. That is, an energy ratio directly corresponds to a distance ratio between the membrane and the sample, and then a sample height may be adjusted in a distance approximately half of the mean free path of E2.

The line profile and the threshold (signal brightness Bz and the image resolution Dz) will be described with reference to FIGS. 6(a) to 6(c). Each distance between the sample 6 and the membrane 10 from FIGS. 6(a) to 6(c) corresponds to each of FIGS. 5(a) to 5(c). when ends of the membrane are X1 and X2, a region to be monitored within the line profile is a signal change corresponding to the brightness B and the image resolution D between X1 and X2 (between X1-X2). Since the member 9 maintaining the membrane is observed from the vacuum side (signal 9' in the view), the charged-particle beam is not scattered by the atmospheric component. Thus, if the sample 6 is not present below the membrane 10, the distance is substantially away from each other, or the like, a signal amount of a signal from the base 9 is greater than signal strength B between X1 and X2. When a signal amount from the member 9 maintaining the membrane is B0 and a signal amount between X1 and X2 is B, the signal amounts are as illustrated in FIG. 6(a). If the distance between the membrane 10 and the sample 6 is close, the signal strength between X1 and X2 is increased. Here, a threshold Bz is set in a certain constant signal amount. That is, the sample 6 approaches the membrane 10 until a state where the signal strength B reaches Bz by observing and monitoring whether the signal strength B between X1 and X2 reaches Bz. In addition, it may also be monitored when reaching a value $\Delta$B that is a difference between B0 and B. For example, if the brightness building the image is formed with 256 gradations (that is, a case where it is digitalized in which the brightest signal is 256 and the darkest signal is 1), if B0 is brightness of 200 gradations and an initial value of B is brightness of 100 gradations, Bz may be 180. In addition, it may be monitored when a value $\Delta$B that is obtained by subtracting B from B0 is 20. Moreover, when the brightness building the image is 256 gradations, if the signal amount B0 from the member 9 maintaining the membrane is set to be 256 or more or the signal strength B between X1 and X2 is set to be 1 or less, correct Bz or $\Delta$B cannot be acquired or monitored. Thus, if brightness building the image is 256 gradations, the distance between the membrane and the sample is whatever, the brightest signal has to be 256 and the darkest signal has to be 1.

Next, a method of observing or monitoring a change in the image resolution D between X1 and X2 will be described. The image resolution D corresponds to a spreading width of the signal due to the sample. Thus, a state where the width of the signal due to the sample becomes a predetermined threshold Dz is recognized or monitored. Dz is a size of an object or half the size of the object that is identified when contrast of the detection signal becomes the maximum. That is, it is a distance from the minimum to the maximum of a line profile signal. Moreover, in setting of the threshold Dz, a ratio with respect to the size of the object is arbitrarily changeable, or the spreading width may be directly designated instead of the ratio with respect to the size of the object. As illustrated in FIGS. 6(b) and 6(c), if the sample and the membrane approach together, the signal B due to the sample is detected between X1 and X2. A state where the width of the signal due to the sample detected between X1 and X2 becomes Dz may be recognized or monitored. In addition, as another method, the signal between the line profiles is performed by Fourier transform and is converted into frequency characteristics, and then a position which becomes a specific frequency fz may be recognized. A state where resolution of the signal due to the sample becomes a certain threshold is determined as a state where the distance between the sample 6 and the membrane 10 becomes Z2.

As described above, it is possible to identify the distance between the sample 6 and the membrane 10 by comparing the line profile to the threshold (signal brightness Bz and the image resolution Dz) by observing or monitoring the line profile. In addition, as another method, the distance between the sample 6 and the membrane 10 is non-contact as long as it is equal to or less than the threshold and thereby observation may be performed without contacting the sample with the membrane. In other words, as described in Example 2 in detail, the threshold can use to alert to the effect that there is a risk that the membrane and the sample come into contact with each other.

Moreover, the above description is given that both the Bz and Dz are observed or monitored, but it may be either one. For example, if the sample 6 is completely flat, the brightness B becomes large, but a change of the image resolution D may not be observed. In this case, only Bz may be observed or monitored.

Figure 7A:
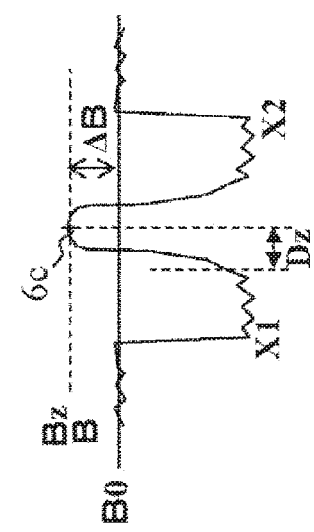
FIGS. 7A-7C are an explanatory view of the signal detection in Example 1.
Figure 7B:
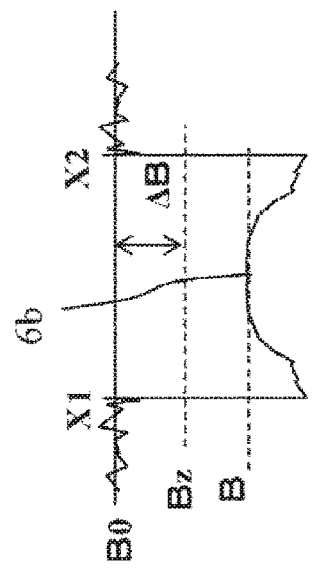
Figure 7C:
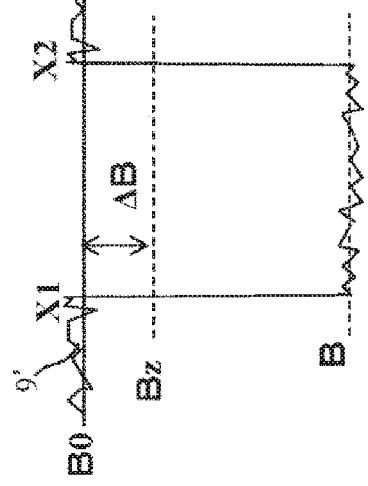

In addition, in a case of the reflected charged-particles that are reflected and returned by elastically scattering or inelastically scattering of the secondary charged-particles returning from the sample 6 to the membrane 10 side, the signal amount detected by the detector 3 depends on an atomic weight of the sample 6. For example, if the base 9 in a periphery of the membrane 10 is silicon and the sample 6 is gold and the like, since the atomic weight of the sample 6 is greater than that of the base 9, as illustrated in FIGS. 7(a) to 7(c), when the distance between the membrane 10 and the sample 6 is short, the signal amount of a signal 6c of the sample 6 is greater than the signal amount from the member or the base 9 maintaining the membrane. Thus, the threshold Bz or ΔB to be recognized or monitored is necessary to be considered depending on a material wanted to be looked at. Conversely, if the material wanted to be looked at is known, it is known that the brightness B becomes a certain degree if whether the distance is formed in a certain degree. Since this is known, as illustrated below in FIG. 10, in a state where the membrane 10 is not present, brightness of the material that is the observation object is acquired in advance and then may also be registered or stored as data.

In addition, whether a certain material becomes certain brightness is slightly different by the apparatus configuration such as the positional relationship between the material and the detector. Thus, as illustrated in FIG. 3(a), in a state where the membrane 10 is not present by the apparatus configuration, the distance between the material and the detector is made to be constant and then the difference in the brightness may be acquired depending on the material by putting various materials into the apparatus.

<Procedure Description>

As described above, the principle, in which the distance between the membrane and the sample is shortened until reaching a certain threshold (signal brightness: Bz and the image resolution Dz) by the irradiation energy E1, and then the distance between the membrane and the sample can be adjusted by observing the image by the irradiation energy E2, is described. Hereinafter, a procedure that performs the image acquisition by controlling the irradiation energy E and the distance Z between the membrane 10 and the sample 6 will be described with reference to FIG. 8. Initially, in step 300, the sample to be observed is disposed on a sample table or the sample stage 5. Next, in step 301, the sample 6 is disposed under the membrane 10. Next, the irradiation energy E1 of the primary charged-particle beam is set (step 302) and then an output of the microscope image is executed by starting beam irradiation (step 303). A desired image brightness and a focus are set in the membrane 10 portion or a peripheral portion thereof (step 304). Finally, since the sample 6 is close to the vicinity of the membrane 10, the edges X1 and X2 of the base 9 included in the membrane 10 may be focused. As described above, the sample 6 comes to the vicinity of the membrane 10 and if the sample 6 comes within a depth of the focus, the focus is automatically fit to the sample 6. Next, in step 305, the threshold (signal brightness Bz and the image resolution Dz) is set. A desired image brightness and the threshold of the image resolution may be stored by the user of the apparatus or as described below, may be set on a computer. When setting on the computer, the desired image brightness and the threshold of the image resolution can be automatically operated by the control section. The threshold is a predetermined value Bz of the brightness of the image or is a signal change corresponding to the image resolution Dz. Next, the membrane 10 and the sample 6 approach together by moving the sample stage 5 (step 306). Next, in the acquired image or profile, whether brightness of the sample over the membrane 10 or the image resolution reaches the threshold is monitored. The operation may be executed by the user visually or as described below, may be automatically monitored by the computer. If it does not reach the threshold, approaching of the membrane 10 and the sample 6 is continued. If it reaches the threshold, whether the distance between the membrane and the sample is a predetermined distance or a distance equal to or less than the predetermined distance is detected or recognized, and approaching of the membrane 10 and the sample 6 is stopped (step 308). In a case where determination on whether or not it reaches the threshold is automatically performed, if a message indicating that it reaches the threshold is displayed on a screen of the computer 35, the user easily grasps the message. Next, the irradiation energy is set to E2 while maintaining the distance between the membrane 10 and the sample 6 (step 309). Finally, the image is acquired from the detection signal obtained from the sample by applying the primary charged-particle beam of the irradiation energy E2 and the observation is executed (step 310). As described above, a method, in which the membrane 10 and the sample 6 approach together while remaining the irradiation energy E1 constant, and the observation is executed by the irradiation energy E2, is described. However, as described in process 311 in the view, after observation is performed by the irradiation energy E2, it may be returned to the observation process 302 of the irradiation energy E1 again. In addition, if the image is acquired satisfactorily only by the irradiation energy E1, the image acquisition for the observation may be performed after step 308 as it is.

In the example, the method of approaching the distance between the membrane and the sample by grasping the positional relationship between the membrane and the sample by changing the irradiation energy can be executed regardless of the shape of the membrane, the shape of the base supporting the membrane, and the like.

The above description is given to recognize the distance Z by changing the irradiation energy E. Hereinafter, one method of recognizing the distance Z by using the image acquired by irradiation of the charged-particle beam or the brightness profile information of the image will be described. An apparatus configuration is similar to the configuration of FIG. 1. However, in the apparatus using in the method, the membrane is provided on the sample side from the detector detecting the secondary charged-particles. In addition, the membrane is maintained on the base made of a material that shields, reflects, or scatters the charged-particle beam and the periphery of the membrane is surrounded by the base. Hereinafter, the "edge of the membrane" indicates a boundary portion between the membrane and the base or a region in the vicinity thereof. In the method, the distance between the membrane and the sample is recognized by using a phenomenon in which the brightness of the image is changed by the position by a size between X1-X2 of the membrane 10, a size of the detector, or a positional relationship thereof. Image formation will be described in detail with reference to FIG. 9. As illustrated in FIG. 9(a1), the detector 3 is an annular type detector 600 provided below the charged-particle optical column 2. The annular type detector refers to a detector in which a hole 601 is provided between a detection surface 501 and a detection surface 502 in the view, through which the primary charged-particle beam on an optical axis passes.

Here, in order to simplify the description, the sample 6 is flat and is configured of the same material. In FIG. 9(a1), a positional relationship between the base 9 and the membrane 10, and shapes thereof are illustrated. After a primary charged-particle beam 602 passes or transmits the membrane 10, and then is applied to the sample, the secondary charged-particles are emitted from the sample. Secondary charged-particles 603 emitted from just below the edge X1 of the membrane or in the vicinity thereof in a direction of the detection surface 501 on the right side in the view reach the detection surface 501 on the right side in the view of the annular detector, but if the base 9 is present, secondary charged-particles 604 emitted in a direction of the detection surface 502 on the left side in the view are shielded by the base 9 and do not reach the detection surface 502 on the left side in the view. Similarly, the secondary charged-particles emitted from just below the edge X2 of the membrane or in the vicinity thereof reach the detection surface 502 on the left side in the view of the annular detector 600, but if the base 9 is present, secondary charged-particles do not reach the detection surface 501 on the right side in the view. On the other hand, secondary charged-particles 606 emitted by a primary charged-particle beam 605 applied to the vicinity of an intermediate of X1-X2 are detected in either the detection surface 501 on the right side and the detection surface 502 on the left side in the view depending on the distance between the sample 6 and the membrane 10. As a result, an acquired image is illustrated in FIG. 9(a2). In FIG. 9(a2), an upper surface portion 9' of the base 9 maintaining the membrane 10, and the membrane portion 10 are observed. In addition, a line profile on A line of FIG. 9(a2) is illustrated in FIG. 9(a3). That is, a detection signal on a side close to the edge (portion bonding to the base 9) of the membrane 10 is smaller than a signal from a center thereof and pixels of the image corresponding to the vicinity of the edge of the membrane 10 are darker than the center position of the membrane. When considering the line profile, a signal detection amount within a range of certain distances from the edge X1 of the membrane 10 is smaller than that of the center position of the membrane. A region in which the signal detection amount is decreased is defined by a signal attenuation distance L. The signal attenuation distance L may be determined by, for example, a distance between a pixel in which brightness is equal to or less than a predetermined ratio with respect to the center position (in other words, a center position of the image) of the membrane and a pixel which corresponds to the edge of the membrane. In addition, as another definition, it may be a distance from an edge of the membrane of a portion having a predetermined brightness value or a brightness value equal to or less than the predetermined brightness value. Here, the signal attenuation distance L is determined only by a geometric relationship. For example, only the distance Z between the sample 6 and the membrane 10 is changeable under conditions that each size of the detector 600, the membrane 10, and the base 9, a positional relationship thereof, and a thickness and an opening angle of an upper surface and a lower surface of the base 9 are constant. Thus, the signal attenuation distance L is a function of only the distance Z. That is, when measuring the signal attenuation distance L, the distance Z is found. Moreover, even if a brightness value of a portion having a predetermined distance from the edge of the membrane is used as a parameter instead of the signal attenuation distance L, it is possible to monitor the distance between the membrane and the sample similar to a method described below. For the sake of simplicity, hereinafter, an example of the signal attenuation distance L will be described.

As illustrated in FIG. 9(b1), if the distance Z between the membrane 10 and the sample 6 is shortened to be Z4 (>Z3), the secondary charged-particles 604, which are emitted from the vicinity of the edge X1 in the direction of the detection surface 502 on the left side in the view, are also detected compared to the case of FIG. 9(a1). Thus, the signal attenuation distance L is close to 0.

In summary, if an amount of the secondary charged-particles generated just below the edges X1 and X2 of the membrane or in the vicinity thereof, specifically, the signal attenuation distance L obtained from the line profile is detected, the distance between the membrane 10 and the sample 6 is determined. As described above, it is possible to monitor the distance Z between the sample 6 and the membrane 10 by observing, measuring, or monitoring the signal attenuation distance L as a parameter. More specifically, since a distribution of the charged-particle beam that is obtained by applying and reflecting the charged-particle beam to and on the sample is obtained in accordance with a cos distribution, the number of the reflected charged-particles emitted in a 45° direction is the highest number. For example, if the detector 600 is sufficiently large and the hole 601 through which the primary charged-particle beam passes is ignored, when an angle between lines connecting the irradiation beam 605 of the primary charged-particle beam, an irradiation position of the charged-particle beam, and the edges X1 and X2 of the membrane is equal to or less than 45°, the image is much darker. Conversely, if the above-described angle is equal to or greater than 45°, the image is brighter and is determined by the geometric relationship. Thus, a relationship of the distance between the apparatus—specified signal attenuation distance L and the membrane—the sample is constant by an area of the membrane 10, the size and the shape of the base 9, the size of the detector 600, the sizes and the positions of the detection surfaces 501 and 502, and the like by the apparatus. Thus, it is possible to estimate the distance Z from the image.

Conversely, as long as the signal attenuation distance L is observed, since the distance between the membrane 10 and the sample 6 is a certain value or more, it is possible to confirm that the sample 6 does not come into contact with the membrane 10 by monitoring the signal attenuation distance L. Thus, it is possible to execute the observation without contacting the sample to the membrane.

In addition, as described above, the amount of the secondary charged-particles depends on the atomic weight of the sample 6. Thus, it is necessary to adjust a threshold Lz to be recognized or monitored depending on the material wanted to be looked at. That is, the material wanted to be looked at is known, it is known that the brightness B becomes a certain degree if whether the distance is formed in a certain degree. Thus, the threshold Lz may be adjusted depending on the material of the sample. The adjustment of the threshold Lz may be performed by the user via the input section of the computer 35 or may be stored by an operation of the user himself or herself.

Figure 10:
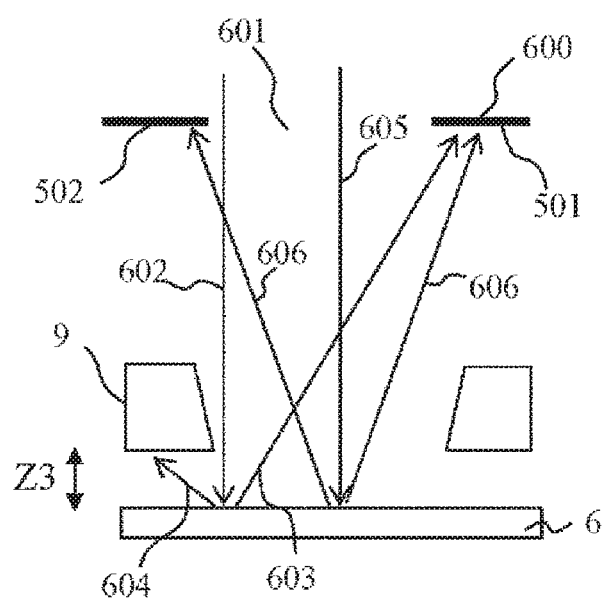
FIG. 10 is an explanatory view of the signal detection in Example 1.

In addition, whether any material becomes any brightness is slightly different by the apparatus configuration such as the positional relationship with the detector. Thus, as illustrated in FIG. 10, in a state where the membrane 10 is not present by the apparatus configuration, the base 9 is disposed, the distance between the detector 600 and the sample 6, and the distance Z between the base 9 and the sample 6 are changed, and whether it becomes any signal attenuation distance L depending on the distance Z may be measured in advance. Measured results may be stored in the storage section of the computer 35 as functions or databases of the signal attenuation distance L with respect to the distance Z for each material, or may be stored by the user himself or herself. Otherwise, in a state where the distance between the membrane and the sample is known by causing a flat sample to collide with a member after putting the member of which a thickness is known between the sample and the membrane, an operation to acquire the signal attenuation distance L may be performed by observing an image. In this case, if a relationship between a thickness t of the above-described member and the signal attenuation distance L by changing the thickness t for several times is stored in the computer 35 as a table, it is also possible to measure a very accurate absolute value of the distance Z.

Figure 11:
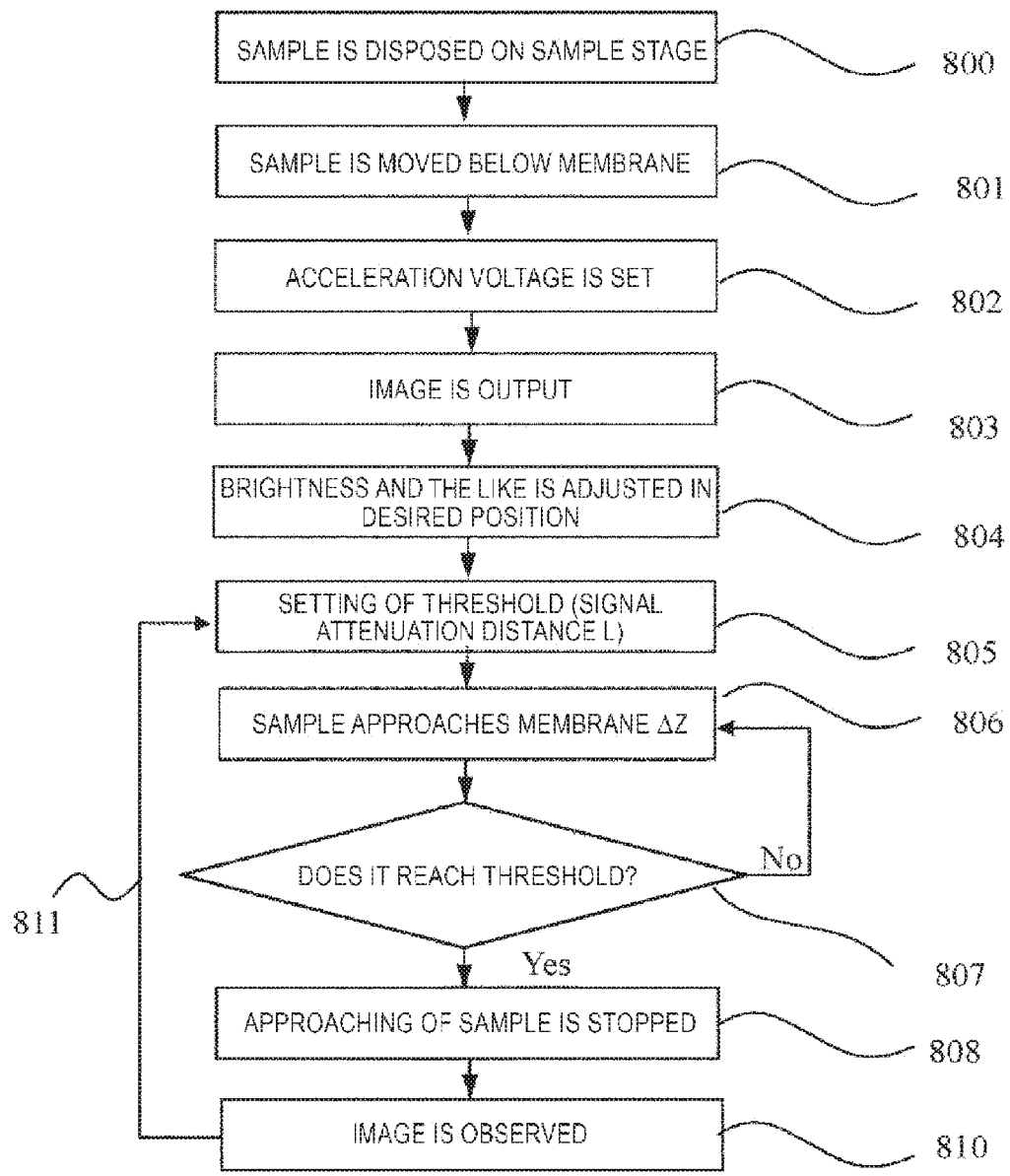
FIG. 11 is an explanatory view of the execution flow in Example 1.

A procedure of performing the image acquisition by controlling the distance Z between the membrane 10 and the sample 6 by using information of the signal attenuation distance L will be described with reference to FIG. 11.

Moreover, in the process, the irradiation energy may be changeable or may be constant. In an initial step, the sample to be observed is disposed on the sample table or the sample stage 5 (step 800). In the next step, the sample 6 is disposed under the membrane 10 (step 801). Next, after an acceleration voltage is set (step 802), the microscope image is acquired by starting beam irradiation (step 803). A desired image brightness and a focus are set in the membrane 10 portion or a peripheral portion thereof (step 804). Finally, since the sample 6 is closer to the vicinity of the membrane 10, a focus may be provided to the edges X1 and X2 of the base 9 including the membrane 10 in step 804. Thus, the sample 6 is close to the vicinity of the membrane 10 and if the sample 6 comes within the depth of the focus, the focus is automatically fit to the sample 6. In the next step, the threshold of the signal attenuation distance L is set (step 805). A desired image brightness and the threshold of the image resolution may be stored by the user of the apparatus or as described below, may be set on a computer and then is automatically operated. The threshold is the signal attenuation distance L. Next, the membrane 10 and the sample 6 are close together by operating the sample stage 5 (step 806). The signal attenuation distance L is monitored over the membrane 10 during approaching of the membrane and the sample and determination is performed on whether the parameters reach the thresholds (step 807). The operation may be executed by the user or may be automatically monitored on the computer described below. If the parameter does not reach the threshold, approaching of the membrane 10 and the sample 6 is continued. If the parameter reaches the threshold or less than the threshold, approaching of the membrane 10 and the sample 6 is stopped. If a monitoring message that the parameter reaches the threshold is displayed on the monitor 33, the user easily grasps the message. For example, a predetermined threshold is set and a process that a warring is issued to the user or moving of the sample stage is limited if the signal attenuation distance L is less than the threshold, and the like may be performed. Setting of the threshold and the display of the warning are performed by the computer 35. Finally, the observation is executed (step 810). However, as described in step 811 in the view, if the distance between the sample and the membrane is not satisfied, the threshold is set again and it may be returned to step 805.

In the example, the method of approaching the distance between the membrane and the sample by grasping the positional relationship between the membrane and the sample by the difference in the brightness by the membrane position is not necessary to change the irradiation energy and is able to execute approaching the sample to the membrane only by the same irradiation energy and observation of the sample compared to the method described above. Therefore, it is possible to execute observation with very high throughput.

Above, the method of grasping the positional relationship between the membrane and the sample is described. That is, this indicates that the distance between the membrane and the sample can be grasped by the image obtained by using the charged-particle beam apparatus. Thus, according to the method of the example, it is possible to reduce risk of the membrane damage due to contact between the membrane and the sample. Particularly, even if there are irregularities in the sample, since the portion just below the membrane and the membrane can be actually monitored, it is possible to reduce risk that the sample is accidentally bumped into the membrane by measuring the interval in an incorrect location. In addition, according to the method of the example, it is possible to grasp the distance between the sample and the membrane by quantitative parameters such as the brightness and resolution of the image, and the signal attenuation distance. Thus, the distance between the sample and the membrane is adjusted so that these parameters become the same value and thereby the distance between the sample and the membrane can be the same for each time. In addition, in order to grasp the distance between the membrane and the sample, a dedicated camera and the like may be mounted, but according to the example, it is possible to grasp the positional relationship between the membrane and the sample only by using the detection principle of the charged-particle beam microscope without mounting other components such as the camera. Thus, it is possible to inexpensively grasp the positional relationship between the membrane and the sample.

Moreover, if the sample such as a soft material and a biological sample is a soft matter, the observation may be executed when the sample comes into contact with the membrane after the sample comes into contact with the membrane. There is a concern that the membrane is damaged when the sample is vigorously hit the membrane even if the sample is very soft. However, after approaching of the sample and the membrane is recognized by using the method according to the example described above, the sample can slowly come into contact with the membrane. Thus, even if the observation is performed by contacting between the sample and the membrane, it is useful to grasp the positional relationship between the sample and the membrane in the example.

EXAMPLE 2

In the example, an apparatus automatically performing the operation, in which the threshold described in Example 1 is monitored and the distance between the membrane 10 and the sample 6 is close, will be described. Particularly, in the flow illustrated in FIG. 8, steps 306, 307, and 308 are automatically executed. Otherwise, steps 806 and 807 of FIG. 11 are automatically executed. Hereinafter, for the same portions as Example 1, description thereof will be omitted.

Figure 12:
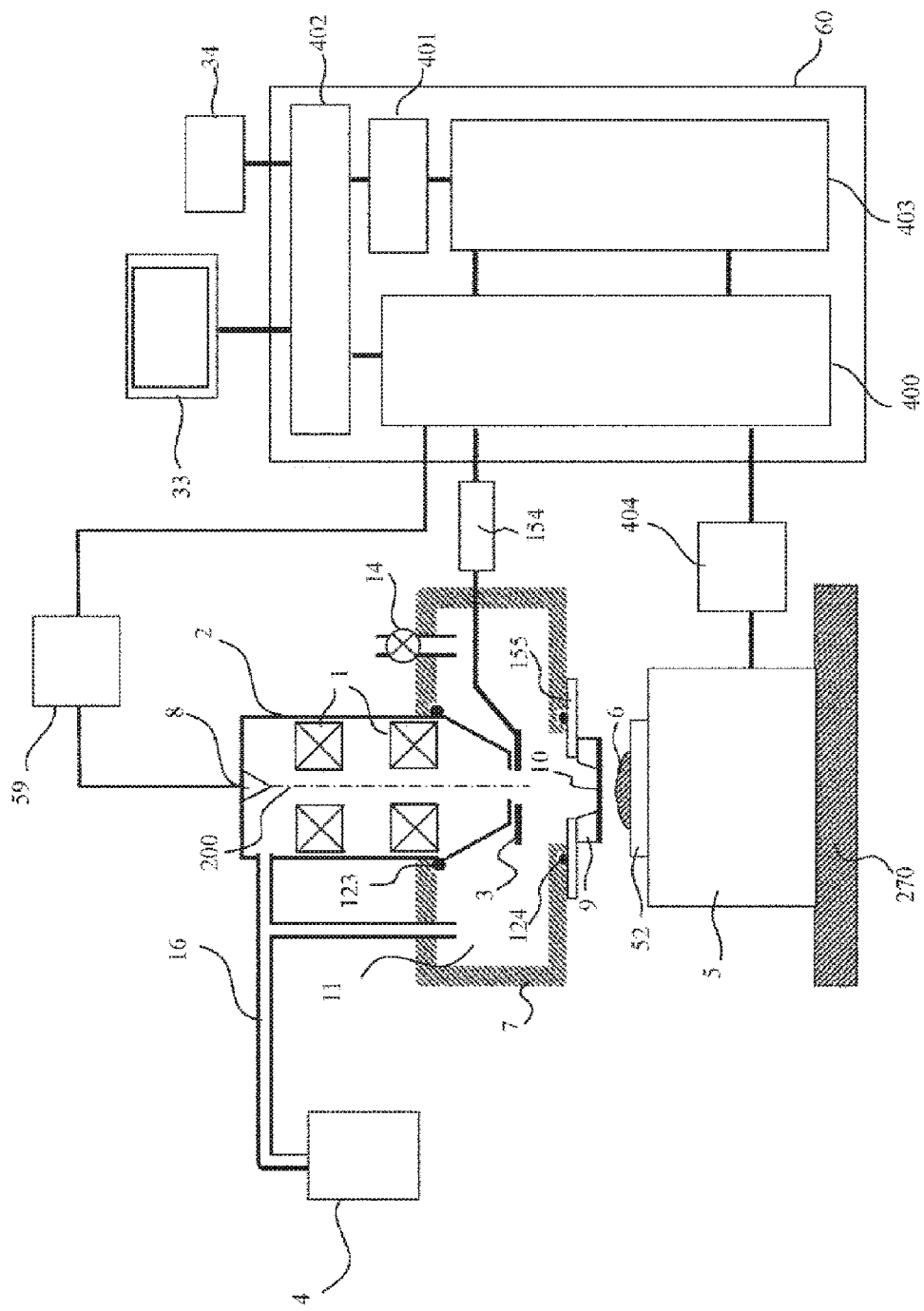
FIG. 12 is a configuration view of a charged-particle microscope of Example 2.

FIG. 12 illustrates an apparatus configuration view. A control section 60 performs recognition and identification of a detection signal, and control of a sample stage 5. The control section 60 is configured of a data transmitting and receiving section 400, a data memory section 401, an external interface 402, a calculation section 403, and the like. The data transmitting and receiving section 400 receives the detection signal and transmits a control signal to a stage 5. The data memory section 401 is able to store an image signal and a line profile signal. The external interface 402 is connected to a user interface 34 such as a monitor 33, a keyboard, and a mouse, and the like. The calculation section 403 recognizes and identifies the image signal and the line profile signal by performing calculation processing on the detection signal. As described in Example 1 and this example, the control section 60 monitors the distance between the sample and the membrane based on the signal from the detector 3 or the image generated from the signal. More specifically, the distance between the sample and the membrane is monitored based on the brightness information or resolution information of the detection signal or the image brightness or the resolution generated from the detection signal. Specific processing contents are the same as the description of Example 1.

The control section 60 can be realized by hardware or software. In addition, analog circuits and digital circuits may be mixed. The detection signal acquired by the detector 3 is amplified by an amplifier 154 and is input into the data transmitting and receiving section 400. The data transmitting and receiving section 400 may have an AD converter that converts an analog signal into a digital signal. In addition, a stage control signal from the data transmitting and receiving section 400 is transmitted to the sample stage 5 via a stage control section 404. Moreover, although not illustrated, the sample 6 and the membrane 10 may be close by a driving mechanism that drives the membrane 10 and the membrane maintaining member 155 in the upward and downward direction in the view instead of approaching the sample 6 and the membrane 10 by moving the sample stage 5 on which the sample 6 is mounted.

The threshold that is set by the monitor 33 and the user interface 34 is stored in the data memory section 401 via the external interface 402. Next, if an approaching operation between the membrane and the sample is started, the control signal is transmitted to the sample stage 5 and the membrane 10 and the sample 6 approach together. A signal input by the detector 3 is input into the calculation section 403 via the amplifier 154 and the data transmitting and receiving section 400, and is compared to threshold data stored in the data memory section 401 by the calculation section 403. For calculation processing, as described in Example 1, the brightness and the signal change of the image signal may be used as parameters or the signal attenuation distance L may be used. When not reaching the threshold, approaching of the membrane 10 and the sample 6 is continued. When reaching the threshold, approaching of the sample is stopped. Steps 306, 307, and 308 in the flow illustrated in FIG. 8 can be automatically executed by such a configuration. Otherwise, steps 806 and 807 of FIG. 11 can be automatically executed.

Figure 13:
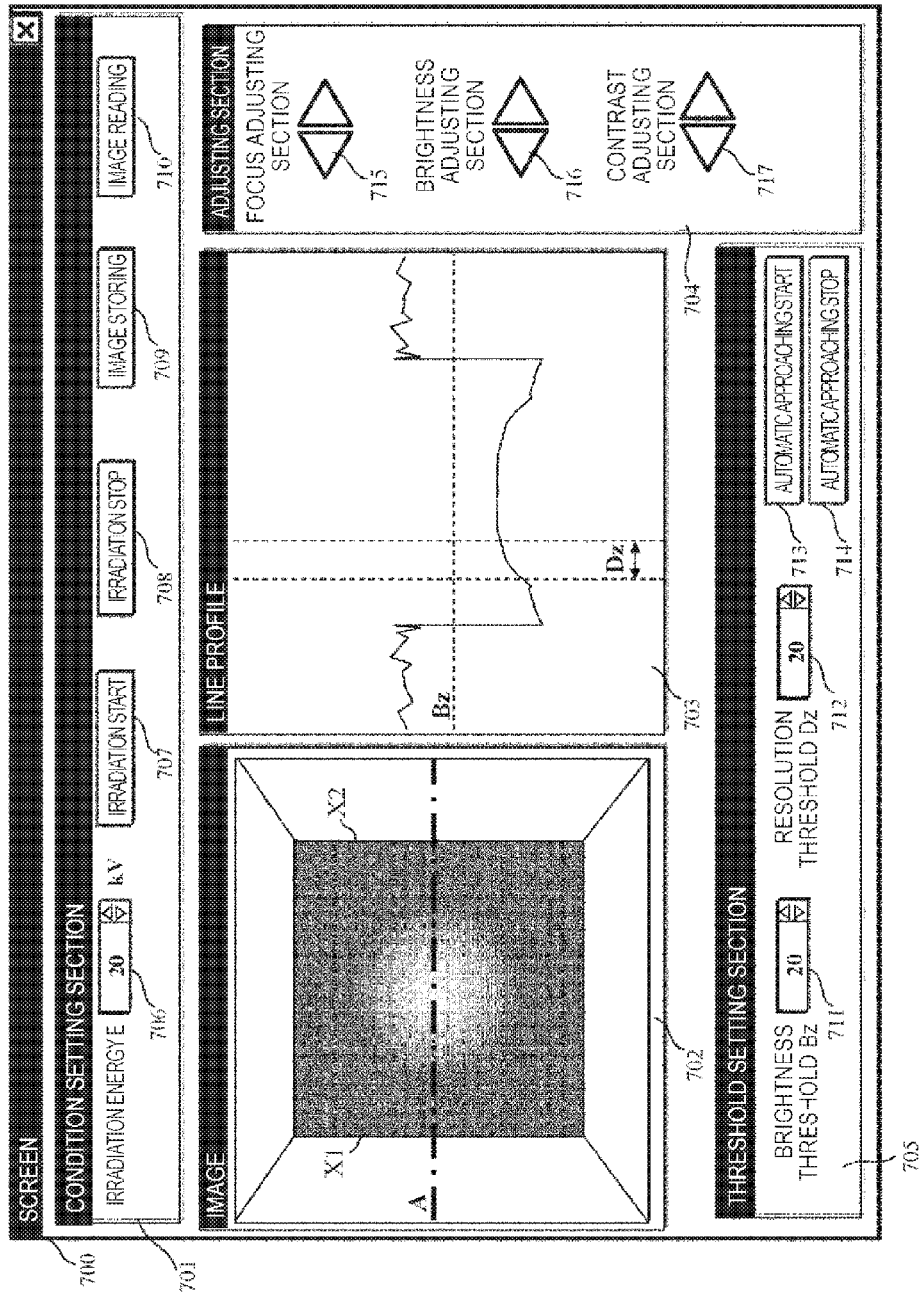
FIG. 13 is an operation screen of the charged-particle microscope of Example 2.

FIG. 13 illustrates an example of an operation screen. Here, as the parameters and the thresholds for measuring the distance between the membrane and the sample, an example of monitoring the signal brightness B and the image resolution D will be described.

An operation screen 700 includes a condition setting section 701, an image display section 702, a line profile display section 703, an image adjusting section 704, a threshold setting section 705, and the like. The condition setting section 701 includes an irradiation energy E setting section 706, an irradiation starting button 707, an irradiation stop button 708, an image storing button 709, an image reading button 710, and the like. Image information and the line A that determines a line that is displayed in the line profile display section 703 are displayed in the image display section 702. Line profile information, a brightness threshold Bz, and a resolution threshold Dz are displayed in the line profile display section 703. The threshold setting section 705 includes a brightness threshold Bz setting section 711, a resolution threshold Dz setting section 712, an automatic approaching start button 713, an automatic approaching stop button 714, and the like. The image adjusting section 704 includes a focus adjusting section 715, a brightness adjusting section 716, a contrast adjusting section 717, and the like. The irradiation energy E setting section 706 may have a switching button and the like so as to simply switch two of a first irradiation energy E1 and a second irradiation energy E2. The line A on the image display section 702 may be moved by an operation mouse, a cursor, and the like. If the line A is moved on the screen, information of the line profile display section 703 is also updated depending on the position of the line A. the threshold Bz and the resolution threshold Dz are indicated by dotted lines on the line profile display section 703, but the dotted lines are moved by the operation mouse, the cursor, and the like, and then the threshold may also be set. In this case, the brightness threshold Bz setting section 711 and the resolution threshold Dz setting section 712 are not present in the threshold setting section 705 and figures may be updated in conjunction therewith. When observing the image, if the focus adjusting section 715, the brightness adjusting section 716, and the contrast adjusting section 717 of the image adjusting section 704 are moved, the image information is updated and the line profile information is also updated in conjunction therewith.

In addition, the line profiles may be displayed in the image display section 702 by being overlapped. In this case, since the line profile display section 703 may be omitted, it is possible to largely display the image display section 702 on the screen 33.

Figure 8:
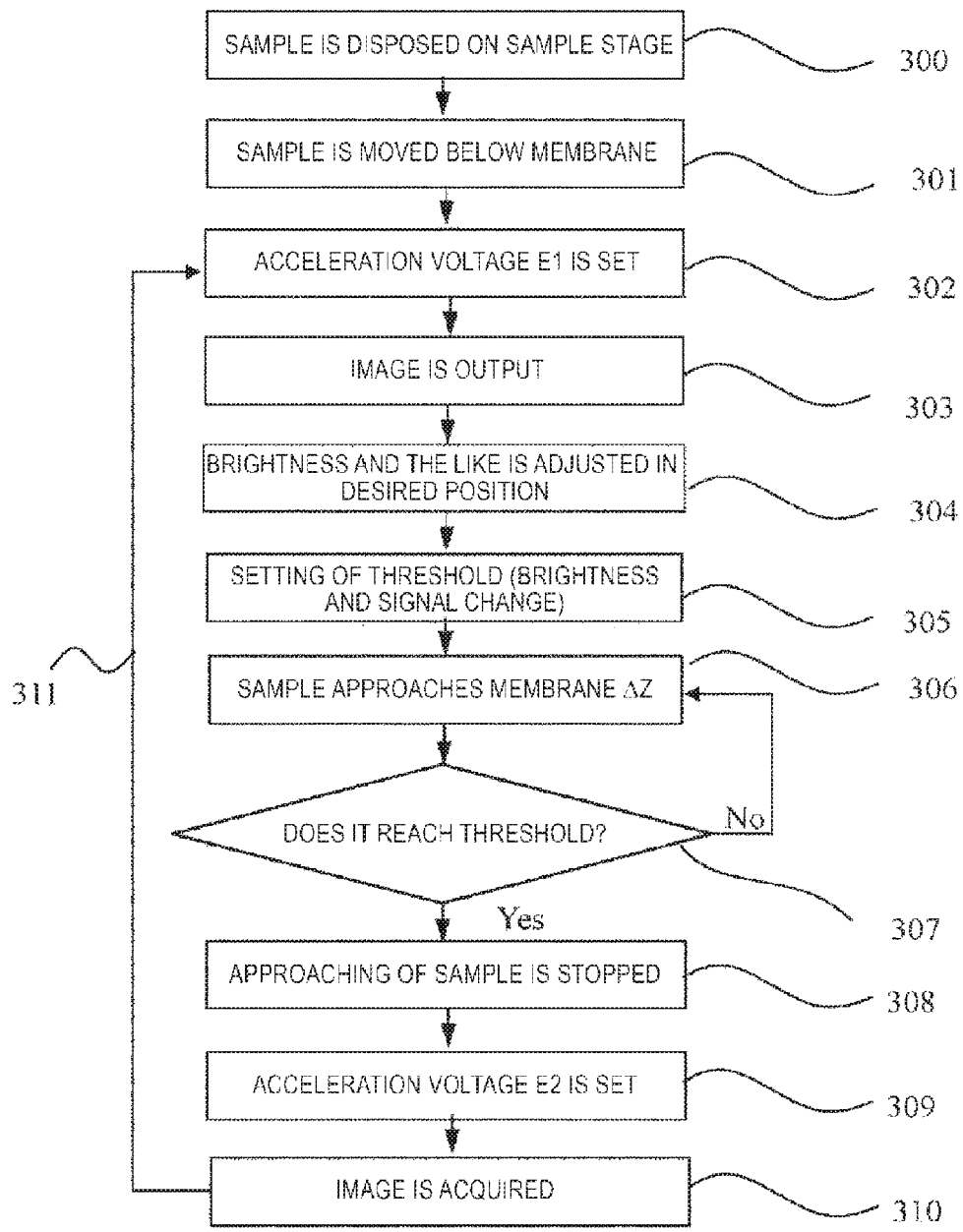
FIG. 8 is an explanatory view of an execution flow in Example 1.

In step 302 of FIG. 8, the irradiation energy of the primary charged-particle beam is set in the first irradiation energy E1 by using the irradiation energy E setting section 706. In the process 303, the observation is started by using the irradiation starting button 707. A desired image is obtained by using the focus adjusting section 715, the brightness adjusting section 716, and the contrast adjusting section 717 of the image adjusting section 704. As described above, the focus may be provided at X1 or X2 that is the edge of the base 9 including the membrane 10 by causing the sample 6 to approach the vicinity of the membrane 10. Next, the threshold of the parameter that is obtained from the detection signal or the image generated from the detection signal via the brightness threshold Bz setting section 711 and the resolution threshold Dz setting section 712. Thereafter, the sample 6 approaches the membrane 10 until the set threshold by pressing the automatic approaching start button 713. The control section 60 monitors whether or not the value of the parameter such as the brightness and the image resolution reaches the threshold during moving of the sample 6. If the value of the parameter does not reach the threshold, the distance adjustment mechanism is driven and approaching of the membrane 10 and the sample 6 is continued. If the value of the parameter reaches the threshold in the middle of automatic approaching, approaching of the sample is stopped. If the user forcibly stops approaching of the membrane 10 and the sample 6 in the middle of automatic approaching, it is possible to stop approaching by pressing the automatic approaching stop button 714. A message or child windows indicating that the threshold is achieved may be displayed on the monitor 33. For example, in a case of reaching the threshold by manually operating the sample stage 5 without pressing the automatic approaching stop button 714, the user can recognize that it reaches the threshold by displaying reaching the threshold on the monitor 33. Thereafter, the irradiation energy E1 is changed to the desired second irradiation energy E2 by using the irradiation energy E setting section 706 and then the observation of high resolution is executed by application of the primary charged-particle beam of the irradiation energy E2.

Moreover, even in a case of using the signal attenuation distance L described above, it may be set by the same operation screen. The signal attenuation distance may be used instead of the brightness and the image resolution, or the signal attenuation distance L may be simultaneously monitored in combination therewith. In this case, the resolution threshold Dz of the threshold setting section may be substituted and another threshold setting unit may be prepared separately. In addition, a setting field of the signal attenuation distance L may be displayed in the threshold setting section 705. In this case, a dotted line indicating the signal attenuation distance L is displayed on the line profile display section 703.

As described in the example or other examples, the charged-particle beam apparatus observing the sample under the atmospheric pressure is also likely to be used by a novice who is not familiar with the use of the charged-particle beam apparatus. it is not always easy to place the sample in a position in which an optimum image can be obtained, but according to the example, the distance between the sample and the membrane can be adjusted automatically or semi-automatically. Thus, it is possible to achieve an effect that the sample position can be adjusted simply and accurately without damaging the membrane or the sample.

Above, in the example, the apparatus of automatically approaching of the membrane and the sample and the method thereof are described, but each control configuration, the wiring path, and the operation screen may be disposed in portions other than the above-described portions, and those belong to the category of the SEM and the charged-particle beam apparatus of the example as long as those satisfy the functions intended in the example.

EXAMPLE 3

Figure 14:
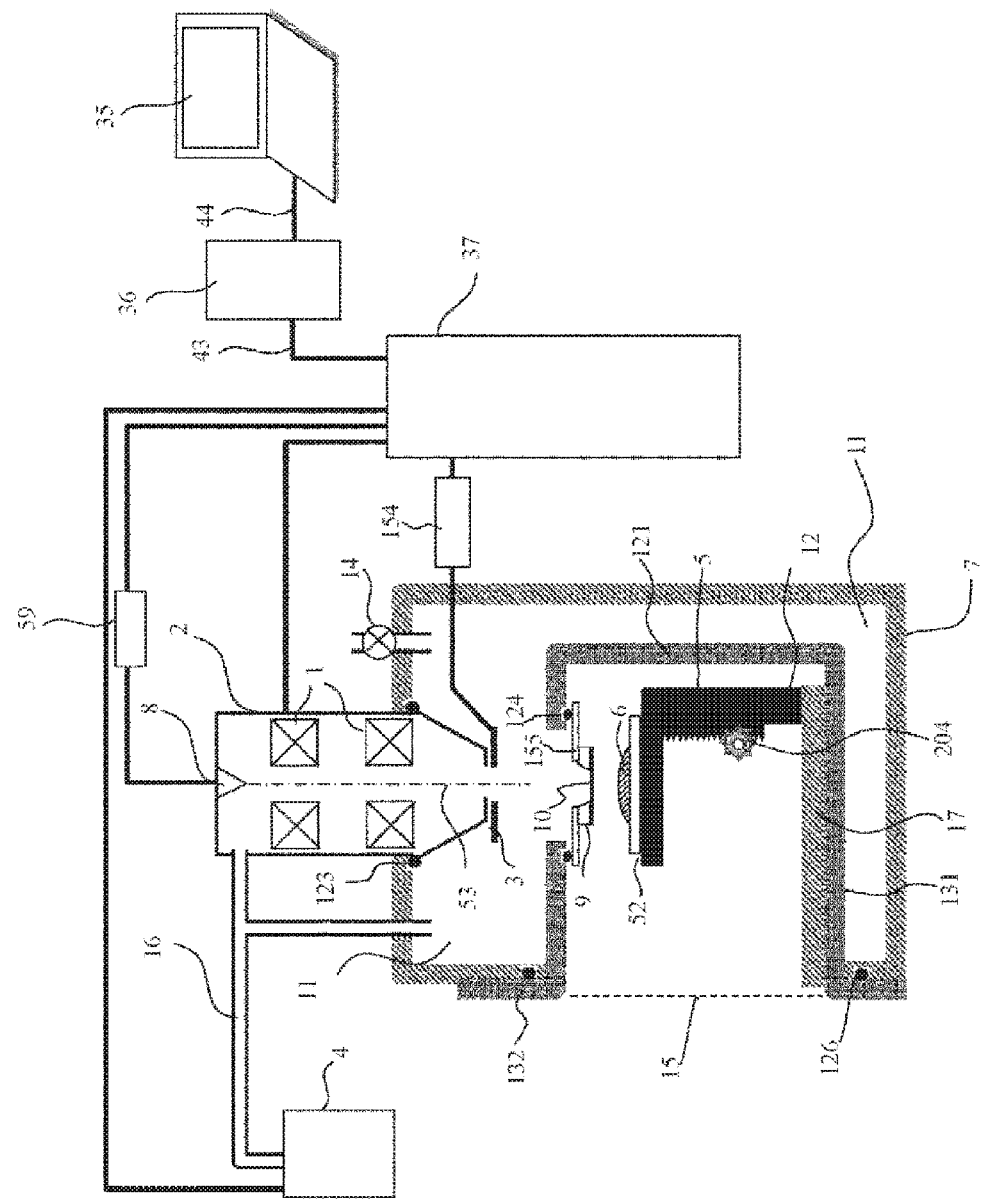
FIG. 14 is a configuration view of a charged-particle microscope of Example 3.

Hereinafter, apparatus configurations of a general charged-particle beam apparatus which can conveniently observe a sample under air will be described. FIG. 14 illustrates an entire configuration view of a charged-particle microscope of the example. Similar to Example 1, the charged-particle beam microscope of the example is also configured of a charged-particle optical column 2, a housing (vacuum chamber) 7 supporting the charged-particle optical column on an apparatus providing surface, a sample stage 5, and the like. Since an operation and function of each element or additional elements added to each element are substantially the same as those of Example 1, detailed description thereof will be omitted.

The configuration includes a second housing (attachment) 121 that is used by inserting into the housing 7 (hereinafter, first housing). The second housing 121 is configured of a rectangular parallelepiped main section 131 and a mating section 132. As described below, at least one side surface of rectangular parallelepiped side surfaces of the main section 131 is an open surface 15. Surfaces of the rectangular parallelepiped side surfaces of the main section 131 other than the surface, in which a membrane maintaining member 155 is provided, may be configured of walls of the second housing 121 or may be configured of side walls of the first housing 7 in a state where the second housing 121 is incorporated in the first housing 7 without walls of the second housing 121 itself. The second housing 121 is fixed to an inner wall surface or the side surface of the first housing 7, or the charged-particle optical column. The main section 131 has a function of accommodating the sample 6 that is an observation object and is inserted into an inside of the first housing 7 through the opening section. The mating section 132 configures a mating surface with an outer wall surface on the side surface side on which the opening section of the first housing 7 is provided and is fixed to the outer wall surface on the side surface side via a vacuum sealing member 126. Thus, an entirety of the second housing 121 is fitted into the first housing 7. It is the most convenient that the opening section is manufactured by using an opening for loading and unloading the sample, which is originally provided in a vacuum sample chamber of the charged-particle microscope. That is, if the second housing 121 is manufactured in accordance with a size of a hole that is originally opened and the vacuum sealing member 126 is mounted on a periphery of the hole, remodeling of the apparatus is necessary for only the minimum requirements. In addition, the second housing 121 can also be removed from the first housing 7.

The side surface of the second housing 121 is the open surface 15 communicating with a surface of an air space of a size capable of putting at least the sample in and out from the air space. The sample 6 accommodated on an inside (right side from a dotted line of the view; hereinafter, referred to as a second space) of the second housing 121 is disposed in an atmospheric pressure state during observation. Moreover, FIG. 14 is a sectional view of the apparatus in a horizontal direction with an optical axis. Thus, only one surface of the open surface 15 is illustrated, but if the second housing 121 is vacuum-sealed by the side surfaces of the first housing in a depth direction and a front direction of a paper surface of FIG. 14, the open surface 15 of the second housing 121 is not limited to one surface. In a state where the second housing 121 is incorporated in the first housing 7, at least the opening surface may be one surface or more. On the other hand, a vacuum pump 4 is connected to the first housing 7 and a closed space (hereinafter, referred to as a first space) configured of the inner wall surface of the first housing 7, an outer wall surface of the second housing, and a membrane 10 is able to be evacuated. In the example, it is possible to separate a second space in a pressure manner by disposing the membrane so as to maintain a pressure of the second space to be greater than a pressure of the first space. That is, a first space 11 is maintained in a high vacuum by the membrane 10 and a second space 12 is maintained in the atmospheric pressure or a gas atmosphere of a pressure substantially equal to the atmospheric pressure. Thus, it is possible to maintain the charged-particle optical column 2 and the detector 3 in a vacuum state and to maintain the sample 6 in the atmospheric pressure during operation of the apparatus. In addition, since the second housing 121 has the opening surface, it is possible to freely exchange the sample 6 during the observation. That is, it is possible to move the sample 6 in the air or pulling the sample 6 out or in from the apparatus while the first space 11 is in the vacuum state.

In a case where an entirety of the second housing 121 is fitted into the first housing 7, a membrane 10 is provided in a position that is just below the charged-particle optical column 2 on an upper surface side of the second housing 121. The membrane 10 is able to cause the primary charged-particle beam emitted from a lower end of the charged-particle optical column 2 to transmit or pass and the primary charged-particle beam finally reaches the sample 6 through the membrane 10.

The sample stage 5 is disposed on an inside of the second housing 121. The sample 6 is disposed on the sample stage 5. The sample stage 5 is used for approaching of the membrane 10 and the sample 6. The sample stage may be manually operated or may be operated by electrical communication with the outside of the apparatus by providing a driving mechanism such as an electric motor in the sample stage 5.

As described above, it is possible to observe the sample in the atmospheric pressure or the gas atmosphere by introducing attachment including the membrane by using the charged-particle beam apparatus that performs imaging under general vacuum. In addition, since the attachment of the example is a system to be inserted from the side surface of the sample chamber, it is easily to be large.

Also according to the apparatus configuration of the example, it is possible to achieve the effect that the sample position can be adjusted simply and accurately without damaging the membrane or the sample by the method described in Examples 1 and 2.

EXAMPLE 4

Figure 15:
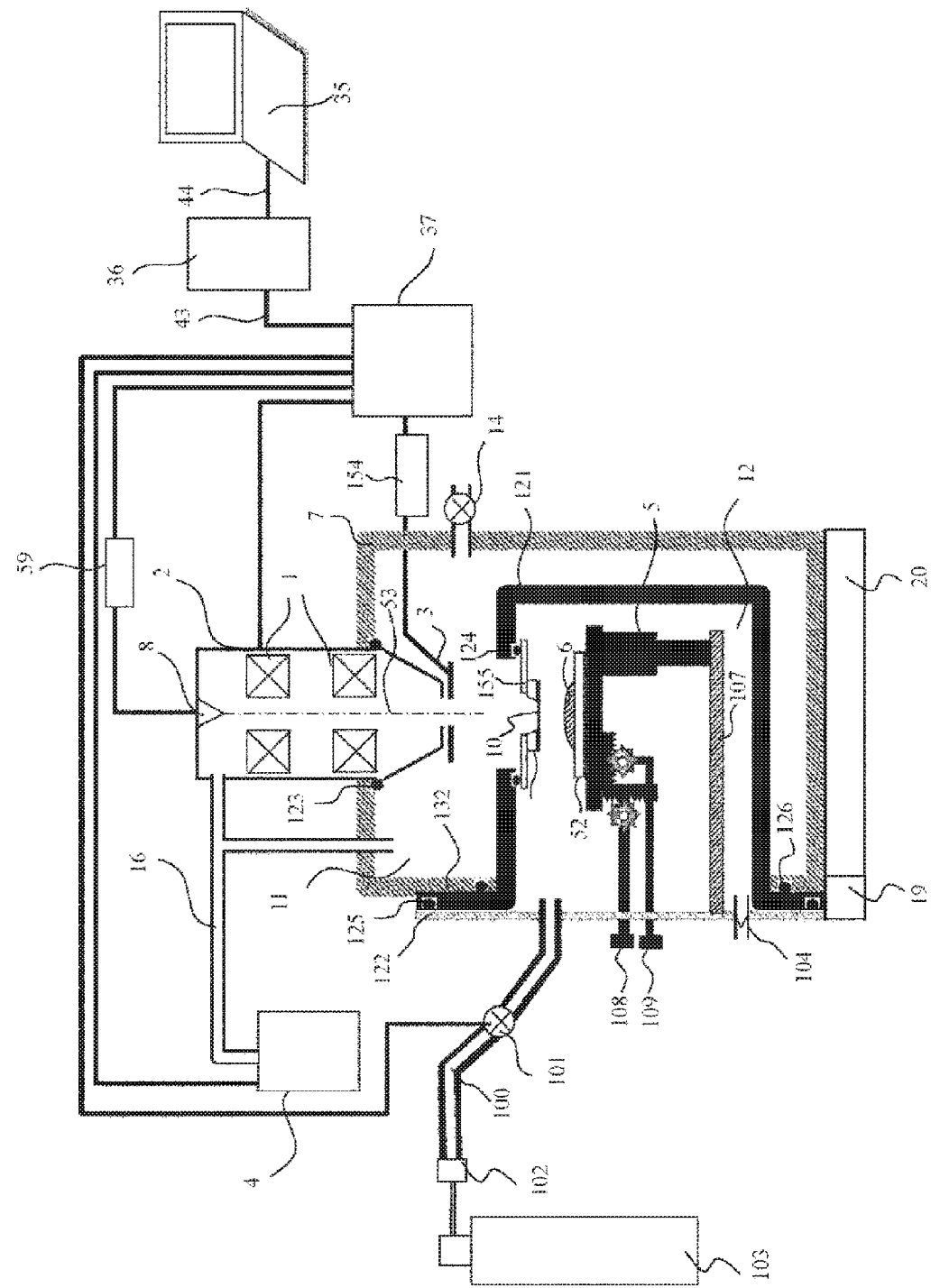
FIG. 15 is a configuration view of a charged-particle microscope of Example 4.

FIG. 15 illustrates an entire configuration view of a charged-particle microscope of the example. Similar to Example 3, the charged-particle microscope of the example is also configured of a charged-particle optical column 2, a first housing (vacuum chamber) 7 that supports the charged-particle optical column on an apparatus mounting surface, a second housing (attachment) 121 that is used by being inserted into the first housing 7, a control system, and the like. Since an operation and function of each element or additional elements added to each element are substantially the same as those of Examples 1 and 2, detailed description thereof will be omitted.

In a case of the charged-particle microscope of the example, it is possible to cover an opening surface forming at least one side surface of the second housing 121 by a lid member 122 and to realize various functions. Hereinafter, those will be described.

The charged-particle microscope of the example includes a sample stage 5 as a unit for moving an observation view field by changing a sample position in the lid member 122. The sample stage 5 includes an X-Y driving mechanism in a direction of a sample surface and a Z-axis driving mechanism in a height direction. A support plate 107 formed of a bottom plate supporting the sample stage 5 is mounted on the lid member 122. The sample stage 5 is fixed to the support plate 107. The support plate 107 is mounted so as to extend toward a surface of the lid member 122 facing the second housing 121 and toward an inside of the second housing 121. Support shafts respectively extend from the Z-axis driving mechanism and the X-Y driving mechanism, and an operation knob 108 and an operation knob 109 provided in the lid member 122 are respectively connected to the Z-axis driving mechanism and the X-Y driving mechanism. The user of the apparatus adjusts the position of the sample 6 within the second housing 121 by operating the operation knobs 108 and 109.

The charged-particle microscope of the example includes a function of supplying replacement gas within the second housing or a function of capable of forming an air pressure state different from outside air that is on the outside of the first space 11 or the apparatus. A charged-particle beam emitted from a lower end of the charged-particle optical column 2 passes through a membrane 10 via the first space that is maintained in high vacuum and enters the second space that is maintained in the atmospheric pressure or a low vacuum (than the first space). Thereafter, the charged-particle beam is applied to the sample 6. In the air space, since the electron beam is scattered by gas molecules, the mean free path is short. That is, if the distance between the membrane 10 and the sample 6 is great, the primary charged-particle beam, or secondary electrons, reflected electrons, transmission electrons, or the like that are generated by application of the charged-particle beam does not reach the sample and the detector 3. On the other hand, scattering probability of the charged-particle beam is proportional to a mass number of and density of the gas molecules. Thus, if the second space is replaced by the gas molecules of which the mass number is lighter than that of air or is slightly evacuated, the scattering probability of the electron beam is lowered and the charged-particle beam reaches the sample. In addition, although not an entirety of the second space, air in at least a passing path of the charged-particle beam in the second space, that is, between the membrane 10 and the sample 6 may be replaced by gas or evacuated.

For the above reasons, in the charged-particle microscope of the example, a mounting section (gas entering section) of a gas supply pipe 100 is provided in the lid member 122. The gas supply pipe 100 is connected to a gas cylinder 103 by a connection section 102 and then the replacement gas enters the inside of the second space 12. A gas control valve 101 is disposed in the middle of the gas supply pipe 100 and a flow rate of the replacement gas flowing through the pipe can be controlled. Thus, a signal line extends from the gas control valve 101 to a lower control section 37. The user of the apparatus can control the flow rate of the replacement gas on an operation screen displayed on a monitor of a computer 35. In addition, the gas control valve 101 may be opened or closed by a manual operation.

As a type of the replacement gas, as long as gas lighter than air such as nitrogen and steam, an effect of improving the image S/N is achieved, and for helium gas and hydrogen gas of which the mass is further light, the effect of improving the image S/N is large.

Since the replacement gas is light element gas, the replacement gas is likely to be accumulated in an upper portion of the second space 12 and is unlikely to be replaced on a lower side. Thus, an opening communicating with an inside and an outside of the second space is provided on a lower side from a mounting position of the gas supply pipe 100 in the lid member 122. For example, in FIG. 15, the opening is provided in a mounting position of a pressure adjusting valve 104. Thus, since atmospheric gas is discharged from the opening on the lower side by being pressed by the light element gas entered from a gas entering section, it is possible to efficiency replace the inside of the second housing 121 with gas. Moreover, the opening may be also served as a rough exhaust port described below.

The pressure adjusting valve 104 may be provided instead of the opening described above. The pressure adjusting valve 104 has a function by which a valve is automatically opened when an internal pressure of the second housing 121 becomes equal to or greater than 1 atm. A atmospheric gas component such as nitrogen and hydrogen is discharged to the outside of the apparatus by automatically opening the pressure adjusting valve if the internal pressure is equal to or greater than 1 atm during entrance of the light element gas. It is possible to fill the inside of the apparatus with the light element gas. Moreover, the illustrated gas cylinder or the vacuum pump 103 may be included in the charged-particle microscope or the user of the apparatus may mount the gas cylinder or the vacuum pump 103 later.

In addition, even the light element gas such as helium gas or hydrogen gas, electron beam scattering may be large. In this case, the gas cylinder 103 may be the vacuum pump. Then, it is possible to make the inside of the second housing be an extremely low vacuum state (that is, atmosphere of a pressure close to the atmospheric pressure) by slightly evaporating. That is, it is possible to make a space between the first membrane 10 and the sample 6 be vacuum state. For example, an evacuation port is provided in the second housing 121 or the lid member 122 and the inside of the second housing 121 is slightly evacuated. Thereafter, the replacement gas may enter. In this case, evacuation may be performed to reduce the atmospheric gas component remaining on the inside of the second housing 121 to be equal to or less than a predetermined amount. Thus, the high vacuum exhaust is not necessary to be performed and rough exhaust is sufficient to be performed.

In addition, although not illustrated, the cylinder 103 portion may be a complex gas control unit and the like that are connected to the gas cylinder and the vacuum pump in a complex manner. Although not illustrated, a heating mechanism for heating the sample 6 may be disposed on the inside of the second housing 121.

In addition, an X-ray detector and a light detector are provided in addition to the secondary electron detector and reflected electron detector, and then EDS analysis and fluorescent beam detection may be performed. The X-ray detector and the light detector may be disposed either the first space 11 or the second space 12.

As described above, in the apparatus configuration, it is possible to control the space in which the sample is mounted to be an arbitrary vacuum degree from the atmospheric pressure (approximately $10^5$ Pa) to approximately $10^3$ Pa. In a so-called low-vacuum scanning electron microscope of the related art, since the electron beam column communicates with the sample chamber, the vacuum degree of the sample chamber is changed in association with a pressure of the electron beam column if the vacuum degree of the sample chamber is lowered to be a pressure close to the atmospheric pressure. However, it is difficult to control the sample chamber to a pressure from the atmospheric pressure (approximately $10^5$ Pa) to approximately $10^3$ Pa. According to the example, since the second space and the first space are separated from each other by the thin film, it is possible to freely control the pressure of the atmosphere and the gas type in the second space 12 surrounded by the second housing 121 and the lid member 122. Thus, it is possible to control the sample chamber to the pressure from the atmospheric pressure (approximately $10^5$ Pa) to approximately $10^3$ Pa that is difficult to be controlled until now. Furthermore, it is possible to observe a state of the sample not only at the atmospheric pressure (approximately $10^5$ Pa) but also continuously changing to a pressure in the vicinity thereof. That is, the configuration of the example has characteristics that the second space 12 on the inside of the second housing is closed compared to the configuration described above. Thus, for example, gas enters between the membrane 10 and the sample 6 or the charged-particle beam apparatus capable of evacuating can be supplied.

In the example, all the sample stage 5, the operation knobs 108 and 109, the gas supply pipe 100, the pressure adjusting valve 104, and a connection section 310 are collectively mounted on the lid member 122. Thus, the user of the apparatus can perform operations of the operation knobs 108 and 109, replacing work of the sample, or operations of the gas supply pipe 100 and the pressure adjusting valve 104 with respect to the same surface of the first housing. Thus, operability is greatly improved compared to the charged-particle microscope having a configuration in which configuration elements described above are individually mounted on other surfaces of the sample chamber.

In addition to the configuration described above, a contact monitor that detects a contact state between the second housing 121 and the lid member 122 is provided and may monitor that the second space is closed or opened.

Above, the apparatus of the example can observe the sample under the atmospheric pressure to a desired replacement gas type or a desired pressure in addition to the effects of Examples 1, 2, and 3. In addition, it is possible to observe the sample under an atmosphere of a pressure different from the first space. In addition, the SEM, which is able to observe the sample in the same vacuum state as the first space in addition to the observation under air or a predetermined gas atmosphere by communicating the first space with the second space by removing the membrane, is realized. Also according to the apparatus configuration of the example, it is possible to achieve the effect that the sample position can be adjusted simply and accurately without damaging the membrane or the sample by the method described in Examples 1 and 2.

In addition, in Example 1, the distance between the membrane and the sample is grasped by changing the irradiation energy to change the mean free path of the charged-particle beam. In the case of this example, it is possible to cause the gas capable of changing the mean free path of the charged-particle beam to enter. For example, in a case of helium gas that is the light element gas and the like, the mean free path is greater than that of air component 10 times or more. Thus, in Example 1, the distance between the membrane and the sample may also be estimated by changing the gas type between the membrane and the sample instead of changing the irradiation energy. In this case, other processes and steps may be similar to Example 1.

EXAMPLE 5

In the example, a configuration that is a modification example of Example 1, in which a charged-particle optical column 2 is present below a membrane 10, will be described. FIG. 16 illustrates a configuration view of a charged-particle microscope of the example. A vacuum pump, a control system, and the like are omitted. In addition, a housing 7 that is a vacuum chamber and the charged-particle optical column 2 are supported on an apparatus installation surface by a pillar, a support, and the like. Since an operation and function of each element or additional elements added to each element are substantially the same as those of the examples described above, detailed description thereof will be omitted.

As illustrated in FIG. 16(a), this apparatus includes a sample stage 5 causing a sample 6 to approach a membrane 10. In apparatus configurations of the example, a sample surface on a lower side of the sample 6 is observed in the view. In other words, in the apparatus configurations of the example, an upper side of the apparatus is opened as an atmospheric pressure space. Also in this case, it is possible to adjust the distance between the membrane and the sample by the method described in Examples 1 and 2.

As illustrated in FIG. 16(b), the sample 6 may directly mount on the membrane 10 side (arrow direction). In this case, the sample stage 5 is not necessarily required. In the example, in order to approach the membrane and the sample 6 by applying the method described in Examples 1 and 2, a thickness is defined between the membrane 10 and the sample 6 and a contact preventing member 56 such as a formed thin film and a removable foil material is used. In this case, the contact preventing member 56 is the distance adjustment mechanism described in Examples 1 and 2. It is possible to safely dispose the sample 6 by providing the contact preventing member 56. For example, a plurality of the contact preventing members 56 having various known thicknesses are prepared. Initially, the contact preventing member 56 having a thickness t1 is disposed on a base 9. Next, the sample 6 is mounted. The observation is executed by irradiation energy E1. If the distance between the sample and the membrane is great and a desired image (or a threshold) is not obtained, the observation is executed by using the contact preventing member 56 having a thickness t2 that is thinner than t1. Replacement is repeatedly performed for the contact preventing member 56 having more appropriate thickness until a desired image (or the threshold) is obtained. Finally, the observation is performed by irradiation energy E2 (>E1). Thus, it is possible to execute the observation without damaging the membrane 10 and the sample 6 by contacting therewith.

EXAMPLE 6

In Example 1, the method of grasping the distance between the membrane—the sample by using the scattering principle by the air component of the charged-particle beam is described. On the other hand, it is also possible to analyze a gas type and a pressure state under the membrane by the charged-particle beam using a scattering principle by the air component of the charged-particle beam. That is, if the distance between the membrane—the sample, the gas type, and the pressure state under the membrane are also considered as a type of information of a non-vacuum atmosphere space under the membrane, it is possible to analyze the distance between the membrane—the sample, the gas type and the pressure state using a signal from a charged-particle detector by using the same scattering principle. Thus, in the example, a method of analyzing a gas state in a non-vacuum space using the charged-particle beam will be described. Moreover, even if the sample is not gas, it is possible to apply the example to the sample if the sample is caused to be the gas state by performing pre-processing such as evaporation. Since the example is provided to analyze the type and the pressure of gas, it can also be called as a mass spectrometer and a type of a gas sensor that detects presence or absence of an amount of specific gas. The example uses the principle greatly different from a mass spectrometer and a gas sensor of the related art in that gas is analyzed by irradiating gas that is an analysis object with the charged-particle beam.

In order to investigate the gas type, the gas pressure, and the like present in a certain space, a gas mass spectrometer, a gas chromatography are generally used. These techniques analyze gas after introducing gas into an analysis chamber that is a vacuum space. For example, in the related art, an apparatus configuration that analyzes gas by ionizing gas after gas to be analyzed is introduced into the vacuum while performing differential evacuation is known.

However, in these related art, since gas is required to be in the analysis chamber, a mechanism for introducing gas is necessary and there is a problem that the apparatus is difficult to be small in size. In addition, since the sample is introduced into the analysis chamber that is the vacuum space, if the analysis chamber is contaminated by the sample, it is necessary to clean or replace the analysis chamber. Thus, it is necessary to perform sufficient pre-processing with respect to the sample.

In order to solve the above-described problems, in the example, in an apparatus including a charged-particle beam source that generates a charged-particle beam; and a membrane through which the charged-particle beam passes or transmits, the charged-particle beam passing and transmitting the membrane is applied to a non-vacuum space in which sample gas that is an analysis object is present, and a pressure or a type of gas, or presence or absence of gas, which is present in the non-vacuum space, is analyzed based on an amount of a signal obtained depending on a scattering amount of the charged-particle beam.

When using the technique in the example, vacuum and air can be separated by using the membrane, and it is possible to simply analyze presence or absence of gas, the gas type, the gas pressure, and the like by applying the charged-particle beam with respect to gas that is the analysis object over the membrane. Thus, gas is not necessary to enter the analysis chamber that is the vacuum space.

Figure 17:
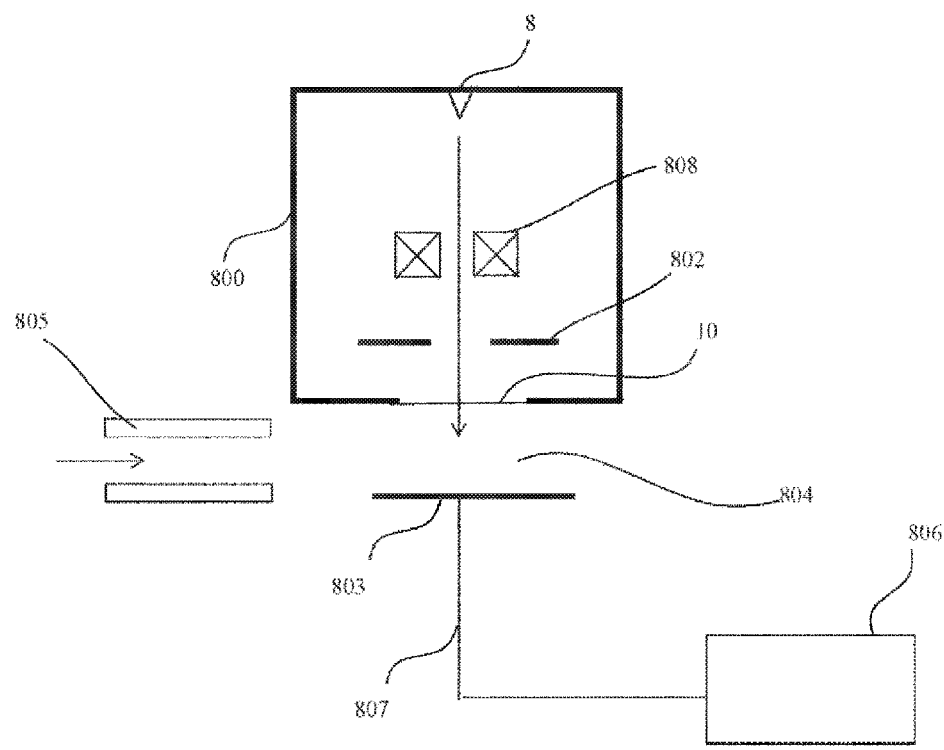
FIG. 17 is a configuration view of a charged-particle microscope of Example 6.

First, an apparatus configuration, which can analyze, measure, or observe the gas type and the gas pressure by the charged-particle beam will be described with reference to FIG. 17. In FIG. 17, a charged-particle source 8 for emitting the charged-particle beam, a charged-particle optical column 800 including the charged-particle source 8, and a membrane 10 are provided. An inside of the charged-particle optical column 800 is evacuated in advance or may be evacuated by a vacuum pump (not illustrated). If evacuation can be performed by the vacuum pump, a throttle (passing hole of the charged-particle beam) can also be used instead of the membrane 10. Emission of the charged-particle beam from the charged-particle source 8 may be performed by heating of the charged-particle beam source or may be withdrawn by a high-voltage electrode (not illustrated). The high-voltage electrode or the charged-particle source 8 may include a unit that adjusts an acceleration voltage. The inside of the charged-particle optical column 800 may also include an optical lens 808 such as the charged-particle beam microscope illustrated in Examples 1 to 5. The optical lens 808 is an electromagnetic field lens and the like capable of changing an emission state, a track, and a focus of the charged-particle beam from the charged-particle source 8. In addition, these components are connected to a control section and operation conditions may be respectively controlled. As a detector capable of detecting the charged-particle beam, a detector 802 and a detector 803 that is disposed in a position separated from the membrane 10 at a predetermined distance are illustrated. The detector may be one or both detectors. Since the number of charged-particles to be detected is changed by a position in which the detector 803 is disposed, a position adjusting mechanism (not illustrated) capable of adjusting the position of the detector may be provided. Gas 804 to be analyzed is present below the membrane 10. Gas 804 may be analyzed in a position in which the charged-particle optical column 800 is disposed and a gas inlet 805 through which gas flows in a horizontal direction in the view may be provided. The detector 802 or 803 is a detection element that can detect the charged-particle beam. The detectors 802 and 803 may further include an amplifying function or an amplifier may be connected. The detectors 802 and 803 are, for example, semiconductor detectors made of a semiconductor material such as silicon, a scintillator capable of converting a charged-particle signal into light on a glass surface or an inside thereof, and the like. A signal detected by the detector 802 or the detector 803 is detected by a measurement instrument 806 via wiring 807 and the like.

First, if the sample that is the analysis object is not gas, the sample is gasified by performing a pre-processing such as controlling a temperature and a pressure by a gasification device provided separately. Next, the sample gas that is the analysis object is introduced into the non-vacuum space under the membrane. Moreover, if presence or absence of gas generation is wanted to be detected by being disposed in a portion in which gas may be generated, the gasification device described above, the gas inlet 805, and the like are not necessarily required.

Since a portion that affects scattering of the charged-particle beam is only a space just below the membrane located on the extension of an optical axis of the charged-particle beam, the sample may be introduced into a local space. Thus, even if the sample is a small amount, it is possible to analyze the sample. In other words, it is possible to analyze the gas pressure or the gas type of a local space by the method of the example. Moreover, here, the local space is a scale of a region on a rectangular parallelepiped of which a height is a distance through which the charged-particle beam is capable of transmitting and a bottom surface is a membrane area. As described in Expression 4 of Example 1, the mean free path of the charged-particle beam is proportional to energy of the charged-particle beam. For example, if the acceleration voltage is 5 kV, the mean free path becomes approximately 15 µm under 1 atm of atmosphere gas. Thus, the scale on the rectangular parallelepiped described above is approximately the area of the membrane× 15 µm. However, if the beam diameter of the charged-particle beam is focused by the optical lens 808 on the inside of the charged-particle optical column 800, it is possible to analyze gas of a further small region. For example, if the beam of the charged-particle beam is throttled and applied only to 1 µm², the gas analysis of a very small region of 15 µm×1 µm×1 µm is performed.

The charged-particle beam that is emitted from the charged-particle source 8 and passes through or transmits the membrane 10 is scattered by gas just below the membrane 10. Thus, the number of charged-particles detected by the detector 802 or the detector 803 is changed depending on a type and an amount of gas molecules present below the membrane. For example, if density of gas 804 present below the membrane is great, since many charged-particle beams are scattered, more charged-particles are returned to the detector 802 as the reflected charged-particles. Thus, an output signal of the detector 802 is increased. The density of gas is great when the pressure of gas is great or the mass number of the gas molecules is great. On the contrary, if the density of gas present below the membrane is small, the charged-particle beam is not much scattered. As a result, the number of the charged-particles to be scattered, which is detected by the detector 802, is relatively small and the output signal of the detector 802 is relatively decreased.

In the detector 803, the charged-particle beam transmitting the space, in which the gas molecules are present, is acquired. Thus, if the density of gas 804 present between the membrane 10 and the detector 803 is great, the number of the charged-particles reaching the detector 803 is small and the output signal from the detector 803 is decreased. On the other hand, if the density of gas present between the membrane 10 and the detector 803 is small, the number of the charged-particles reaching the detector 803 is great and the output signal from the detector 803 is increased. It is possible to analyze the gas state under the membrane 10 by analyzing or comparing the sizes of the signals by detecting the signals.

Since the signal detected by the detector 802 or the detector 803 is to be a size corresponding to the amount of charged-particles detected by each detector, the signal is output as a numeral value or a graph by being analyzed by the measurement instrument 806. For example, since the change in the signal amount can be acquired by continuously applying the charged-particle beam for a certain time, it is possible to acquire the change in the signal amount and to display a graph of which a horizontal axis is time and a vertical axis is the signal amount. The vertical axis is a scattered signal amount and scanning of the charged-particle beam is determined by an atomic weight Z and a pressure P of gas. Thus, if the pressure P is constant, the vertical axis may be the atomic weight Z. Otherwise, if the gas type is known, the vertical axis may be the pressure P and when detecting suddenly generated gas and the like, the graph and the numeral value are not displayed, instead thereof, or in addition thereto, presence or absence of gas may be known such as light and buzzer sound. The numeral value and the graph are displayed by a monitor of a computer (not illustrated) connected to the measurement instrument 806.

Moreover, when acquiring the numeral value and the graph of the detection signal described above, it becomes erroneous information if irradiation amount of the charged-particle beam is varied. Thus, a current amount from the charged-particle source 8 may be monitored. Monitoring of the current amount is performed by detecting the reflected charged-particles, which are reflected on the detector 802 by applying the charged-particle beam once to a location such as a base of the membrane (not illustrated) and the charged-particle optical column 800 which is not in the membrane 10, or acquiring an absorbing current. Monitoring of the primary charged-particle beam is always or periodically performed. The operation may be executed by the user or may be automatically monitored.

Figure 18:
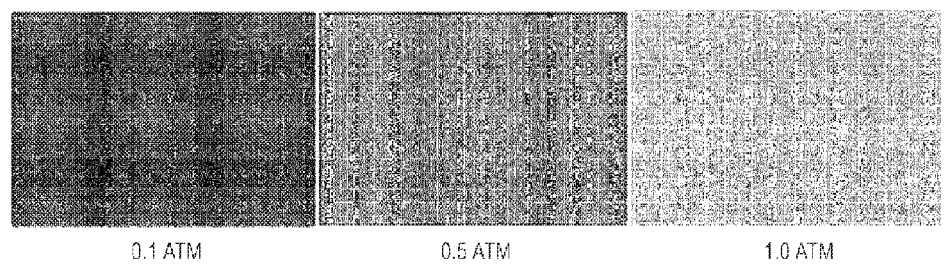
FIG. 18 is an explanatory view of a difference in detection signals in a gas pressure in Example 6.

In addition, as illustrated in FIGS. 1 and 15, if the configuration of the charged-particle optical column 800 includes the optical lens capable of changing the track, the focus, and the like of the charged-particle beam and a control section for displaying the image, gas analysis may be performed from the brightness of the image by acquiring the image. As an example, experimental results which are imaged from the signal detected by the detector 3 are illustrated in FIG. 18. FIG. 18 is an example of a case where the pressure of gas below the membrane 10, in a state where the sample 6 is not present below the membrane 10 in the apparatus configuration of FIG. 15, is changed to 0.1 atm, 0.5 atm, and 1.0 atm. In this case, the detector 3 is positioned on the charged-particle source side (vacuum space) from the membrane. If the pressure of gas under the membrane 10 is 0.1 atm, since the number of the charged-particles returning to the detector 3 is small, the sample is looked at dark as the image brightness. On the other hand, if the pressure of gas under the membrane 10 is 1.0 atm, since the number of the charged-particles returning to the detector 3 is great, the sample is looked at bright as the image brightness. Thus, it is indicated that the gas pressure is known from the image brightness detected by the detector 3.

Above, the gas pressure is described, but it is similar to the gas type. For example, when comparing helium gas and argon gas, since a size of atoms of helium gas is very smaller than that of argon gas, the charged-particle beam is unlikely to be scattered. On the contrary, since the size of atoms of argon gas is very greater than that of helium gas, the charged-particle beam is likely to be scattered. It is possible to analyze the gas type by detecting the scattering amount by the detector 802, the detector 803, and the like.

FIG. 19 illustrates another configuration for detecting gas using the example. If the method in the example is used, since gas of a very small region can be analyzed, as illustrated in FIG. 19(a), it is possible to analyze gas 804 generated from a specific portion 811 occurred from a very fine region on a base 812. For example, if effective catalysts are wanted to be discovered in catalyst development, various types of the catalysts are disposed on the base 812, the catalysts are disposed below the membrane 10, and thereby it is possible to observe various catalyst reaction effects described above. In this case, as described in Examples 1 to 5, the base 812 is mounted on the sample stage 5 and it is possible to dispose the sample stage 5 under the membrane 10 by moving the sample stage 5. In addition, the base 812 is scanned with the charged-particle beam by moving the stage and the change in the signal amount is analyzed from the detector corresponding to a scan position. Thus, it is also possible to detect the specific region in which gas is generated. Moreover, a temperature heater capable of changing a temperature and the like may be provided in the sample stage 5 or the base 812. In addition, as illustrated in FIG. 19(b), a configuration, in which gas 804 that is wanted to be analyzed is put on the inside of a gas sealing container 810 including a membrane 809 and the gas sealing container 810 is mounted on the charged-particle optical column 800 including an opening 813, may be provided. In this case, the membrane 809 is mounted on the gas sealing container and the membrane is disposed on the side on which the charged-particle beam is applied. Gas is analyzed by approaching or contacting the opening 813 with the gas sealing container 810 including the membrane 809 so that the charged-particle beam is not exposed to gas other than gas 814 that is wanted to be analyzed. Vacuum may be maintained on the inside of the charged-particle optical column 800 by a vacuum pump (not illustrated) by making the opening 813 sufficiently small. In addition, as illustrated in FIG. 19(c), a membrane 10 is included in the charged-particle optical column 800 and the analysis may be performed by causing the gas sealing container 810 including the membrane 809 described above to approach the membrane 10. In this case, since vacuum is always maintained on the inside of the charged-particle optical column 800, an exhaust speed of the vacuum pump (not illustrated) for the charged-particle optical column 800 is decreased. Moreover, as described above, since gas analysis of a very small region can be performed, it is possible to greatly decrease the size of the gas sealing container 810. Thus, according to the method of the example, gas 814 that is wanted to be analyzed is also very small.

According to the example, the vacuum space is only the charged-particle optical column 800 and it is possible to analyze the sample in the non-vacuum space. Thus, an apparatus for gasification of the analysis chamber and a mechanism for introducing the sample into the analysis chamber can be unnecessary or simplified, and reduction of the size of the apparatus can be achieved. Particularly, since vacuum is maintained on the inside of the charged-particle optical column that is the vacuum space as long as the membrane is not damaged, it is also possible to be portable by reduction of the size. In addition, since the sample is positioned within the non-vacuum space, the vacuum chamber is not polluted by introduction of the sample. Furthermore, even if the membrane is polluted or damaged, since the membrane is inexpensive, it is possible to simply restore the vacuum chamber to a state of not being polluted by exchanging the membrane.

Figure 20:
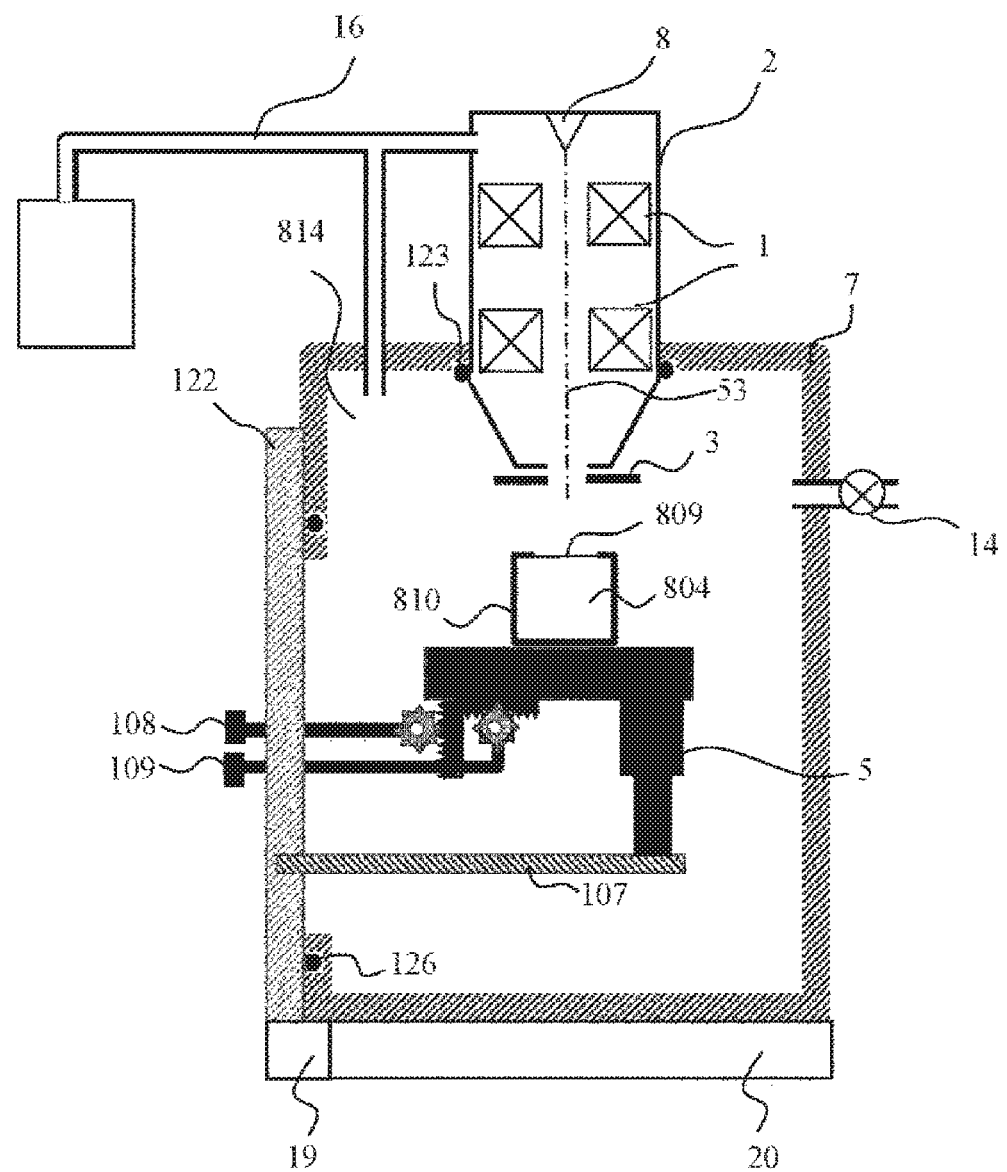
FIG. 20 is a configuration view of the charged-particle microscope of Example 6.

In addition, as illustrated in FIG. 20, the gas sealing container 810 that includes the membrane 809 and contains gas 804 that is wanted to be analyzed may be put into a vacuum space 814 of a general charged-particle beam apparatus such as an electronic microscope. Also in this case, gas analysis can be performed by signal processing similar to the method described above. In this case, it is possible to use a general charged-particle beam apparatus. Thus, gas 804 that is wanted to be analyzed is only put into the gas sealing container 810 and it is possible to perform gas analysis very simply without introducing a new apparatus.

The analyzing method of the example can be widely used, particularly, in fields of analyzing gas such as a food field, a medical field, material analysis, and a chemical industry field. Furthermore, in the example, if the apparatus is a very small apparatus, the apparatus can also be used as a gas sensor that detects presence or absence of gas and the like by mounting on a building and a vehicle.

Moreover, the invention is not limited to the examples described above and includes various modification examples. For example, the examples described above are described in detail in order to easily describe the invention, but the invention is not limited to the apparatus that necessarily includes all configurations described above. In addition, a part of the configurations of a certain example is able to be replaced by the configurations of another example. In addition, the configurations of another example can also be added to the configurations of a certain example. In addition, for a part of the configurations of the examples, it is possible to add, delete, and replace the other configurations. In addition, a part or all each configuration, the function, the processing section, the processing unit, and the like may be realized as hardware, for example, by designing as an integrated circuit. In addition, each configuration, the function, and the like described above may be realized as software by interpreting and executing programs in which a processor realizes each function.

Information of programs, tables, files, and the like realizing each function can be positioned in a recording apparatus such as a memory, a hard disk, and a solid state drive (SSD), or a recording medium such as an IC card, a SD card, and an optical disk.

In addition, the control line and the information line, which are believed to be necessary for description, are illustrated and it does not necessarily indicate all the control lines and the information lines on products. In practice, almost all of configurations may be considered to be connected to each other.

REFERENCE SIGNS LIST

1: optical lens, 2: charged-particle optical column, 3: detector, 4: vacuum pump, 5: sample stage, 6: sample, 7: housing, 8: charged-particle source, 9: base, 10: first membrane, 11: first space, 12: second space, 14: leakage valve, 16: vacuum pipe, 17: stage support base, 18: pillar, 19: lid member support member, 20: bottom plate, 33: monitor, 34: user interface such as keyboard and mouse, 35: computer, 36: upper control section, 37: lower control section, 43, 44, 45: communication line, 52: sample stage, 53: optical axis, 56: contact preventing member, 59: irradiation energy control section, 60: control section, 100: gas supply pipe, 101: gas control valve, 102: connection section, 103: gas cylinder or vacuum pump, 104: pressure adjusting valve, 107: support plate, 108, 109: operation knob, 121: second housing, 122, 130: lid member, 123, 124, 125, 126, 128, 129: vacuum sealing member, 131: body section, 132: mating section, 154: signal amplifier, 155: membrane maintaining member, 200: optical axis, 201: primary charged-particle beam, 202: primary charged-particle beam, 203: secondary charged-particle, 210: change in signal brightness during irradiation energy E1, 211: change in signal brightness during irradiation energy E2, 212: change in image resolution during irradiation energy E1, 213: change in image resolution during irradiation energy E2, 400: data transmitting and receiving section, 401: data memory section, 402: external interface, 403: calculation section, 404: stage control section, 501: detection surface, 502: detection surface, 600: detector, 601: hole, 602: primary charged-particle beam, 603: secondary charged-particle, 604: secondary charged-particle, 605: primary charged-particle beam, 700: operation screen, 701: condition setting section, 702: image display section, 703: line profile display section, 704: image adjusting section, 705: threshold setting section, 706: irradiation energy E setting section, 707: irradiation starting button, 708: irradiation stop button, 709: image storing button, 710: image reading button, 711: brightness threshold Bz setting section, 712: resolution threshold Dz setting section, 713: automatic approaching start button, 714: automatic approaching stop button, 715: focus adjusting section, 716: brightness adjusting section, 717: contrast adjusting section, 800: charged-particle optical column, 802: detector, 803: detector, 804: gas, 805: gas inlet, 806: measurement instrument, 807: wiring, 808: optical lens, 809: membrane, 810: gas sealing container, 811: specific portion, 812: base, 813: opening, 814: vacuum space

The invention claimed is:

1. A charged-particle beam apparatus comprising:
a charged-particle optical column that irradiates a sample with a primary charged-particle beam;
a housing that forms a part of the charged-particle beam apparatus and that has an inside thereof which is evacuated by a vacuum pump;
a membrane which is able to maintain differential pressure between a space which is evacuated and a space in which the sample is disposed, and through which the primary charged-particle beam transmits or passes;
a detector that detects secondary charged-particles that are obtained by irradiating the sample with the primary charged-particle beam;
a distance adjusting mechanism that varies a distance between the sample and the membrane; and
a control section that monitors the distance between the sample and the membrane based on a detection signal that is output from the detector or an image that is generated from the detection signal;
wherein the control section detects that the distance between the sample and the membrane becomes a specific distance or becomes closer than the specific distance by brightness information or resolution information of the detection signal or brightness or resolution of an image generated from the detection signal when the primary charged-particle beam is applied by first irradiation energy;
further comprising:
an irradiation energy control section that varies irradiation energy of the primary charged-particle beam to the sample in at least two or more conditions;
wherein the control section acquires the image of the sample from the detection signal that is obtained from the sample by applying the primary charged-particle beam by second irradiation energy that is higher than the first irradiation energy after the distance between the sample and the membrane is detected to be the specific distance or closer than the specific distance.

2. The charged-particle beam apparatus according to claim 1,
wherein the control section monitors the distance between the sample and the membrane based on brightness of a portion that is in a predetermined distance from an edge of the membrane in the image or a distance of a portion, which is darker than predetermined brightness, from the edge of the membrane in the image.

3. A charged-particle beam apparatus comprising:
a charged-particle optical column that irradiates a sample with a primary charged-particle beam;
a housing that forms a part of the charged-particle beam apparatus and that has an inside thereof which is evacuated by a vacuum pump;
a membrane which is able to maintain differential pressure between a space which is evacuated and a space in which the sample is disposed, and through which the primary charged-particle beam transmits or passes;
a detector that detects secondary charged-particles that are obtained by irradiating the sample with the primary charged-particle beam;
a distance adjusting mechanism that varies a distance between the sample and the membrane;
a control section that monitors the distance between the sample and the membrane based on a detection signal that is output from the detector or an image that is generated from the detection signal; and
a threshold setting section that sets a threshold of a parameter obtained from the detection signal that is output from the detector or the image that is generated from the detection signal;
wherein the control section monitors whether or not a value of the parameter reaches the threshold that is set by the threshold setting section;
wherein the distance between the sample and the membrane is closed by the distance adjusting mechanism until the distance reaches the threshold; and
wherein the parameter is the resolution information of the detection signal generated from the sample, or the resolution of the image that is generated from the detection signal.

4. A sample image acquiring method using a charged-particle beam apparatus including a charged-particle optical column that irradiates a sample with a primary charged-particle beam; a housing that forms a part of the charged-particle beam apparatus and that has an inside thereof which is evacuated by a vacuum pump; a membrane which is able to maintain differential pressure between a space which is evacuated and a space in which the sample is disposed, and through which the primary charged-particle beam transmits or passes; and a detector that detects secondary charged-particles that are obtained by irradiating the sample with the primary charged-particle beam, the method comprising:
a step of monitoring a distance between the sample and the membrane based on a detection signal that is output from the detector or an image that is generated from the detection signal;
wherein detecting or recognizing that the distance between the sample and the membrane becomes a specific distance or becomes closer than the specific distance by detecting or recognizing brightness information or resolution information of the detection signal or brightness or resolution of an image generated from the detection signal when the primary charged-particle beam is applied by first irradiation energy, is performed; and
a step of acquiring the image of the sample from the detection signal when the primary charged-particle beam is applied by second irradiation energy that is higher than the first irradiation energy after the distance between the sample and the membrane is detected or recognized to be the specific distance or closer than the specific distance.

5. The sample image acquiring method according to claim 4, further comprising:

a step of monitoring the distance between the sample and the membrane based on brightness of a portion that is in a predetermined distance from an edge of the membrane in the image or a distance of a portion, which is darker than predetermined brightness, from the edge of the membrane in the image.

6. A sample image acquiring method using a charged-particle beam apparatus including a charged-particle optical column that irradiates a sample with a primary charged-particle beam; a housing that forms a part of the charged-particle beam apparatus and that has an inside thereof which is evacuated by a vacuum pump; a membrane which is able to maintain differential pressure between a space which is evacuated and a space in which the sample is disposed, and through which the primary charged-particle beam transmits or passes; and a detector that detects secondary charged-particles that are obtained by irradiating the sample with the primary charged-particle beam, the method comprising:

a step of monitoring a distance between the sample and the membrane based on a detection signal that is output from the detector or an image that is generated from the detection signal;

a step of determining a threshold of a parameter obtained from the detection signal that is output from the detector or the image that is generated from the detection signal, a step of monitoring whether or not the parameter reaches the threshold, and a step of causing the distance between the sample and the membrane to be closer to each other until the distance reaches the threshold;

wherein the parameter is the resolution information of the detection signal generated from the sample, or the resolution of the image that is generated from the detection signal.

* * * * *